United States Patent
Sugahara

(10) Patent No.: US 8,894,189 B2
(45) Date of Patent: Nov. 25, 2014

(54) LIQUID DROPLET JETTING APPARATUS AND PIEZOELECTRIC ACTUATOR

(71) Applicant: Hiroto Sugahara, Ama (JP)

(72) Inventor: Hiroto Sugahara, Ama (JP)

(73) Assignee: Brother Kogyo Kabushiki Kaisha, Aichi-ken (JP)

( * ) Notice: Subject to any disclaimer, the term of this patent is extended or adjusted under 35 U.S.C. 154(b) by 0 days.

(21) Appl. No.: 13/778,335

(22) Filed: Feb. 27, 2013

(65) Prior Publication Data

US 2013/0257998 A1 Oct. 3, 2013

(30) Foreign Application Priority Data

Mar. 30, 2012 (JP) ................. 2012-081178

(51) Int. Cl.
- B41J 2/045 (2006.01)
- H01L 41/09 (2006.01)
- B41J 2/14 (2006.01)

(52) U.S. Cl.
CPC ............ B41J 2/045 (2013.01); H01L 41/0926 (2013.01); H01L 41/0973 (2013.01); B41J 2/14233 (2013.01); B41J 2002/14459 (2013.01); B41J 2002/14491 (2013.01); B41J 2202/18 (2013.01)
USPC .......................................................... 347/69

(58) Field of Classification Search
CPC .... B41J 2/045; B41J 2/14201; B41J 2/14274; B41J 2/1606; B41J 2/1607; B41J 2/1612; B41J 2/1618; B41J 2/162; B41J 2/295; B41J 2/14233; B41J 2002/18; B41J 2002/14459; B41J 2002/14491; H01L 41/0926; H01L 41/0973
USPC .......................................................... 347/69
See application file for complete search history.

(56) References Cited

U.S. PATENT DOCUMENTS

| | | | | |
|---|---|---|---|---|
| 5,696,545 A | * | 12/1997 | Ochiai et al. | 347/71 |
| 6,142,615 A | * | 11/2000 | Qiu et al. | 347/70 |

(Continued)

FOREIGN PATENT DOCUMENTS

| | | | | |
|---|---|---|---|---|
| JP | 10217458 | * | 8/1998 | ........ B41J 2/45 |
| JP | 2005/096346 | | 4/2005 | |
| JP | 2006/093348 | | 4/2006 | |
| JP | 2008/105405 | | 5/2008 | |

OTHER PUBLICATIONS http://www.siliconfareast.com/dielectric-constant.htm (Nov. 20, 2013).*

*Primary Examiner* — Alessandro Amari
*Assistant Examiner* — Michael Konczal
(74) *Attorney, Agent, or Firm* — Frommer Lawrence & Haug LLP

(57) ABSTRACT

There is provided a liquid droplet jetting apparatus including: a channel unit, a piezoelectric actuator disposed on the channel unit, and a drive unit. The piezoelectric actuator includes first and second piezoelectric layers, an inner electrode disposed between the first and second piezoelectric layers, a first outer electrode disposed in an area facing the inner electrode, of a surface of the first piezoelectric layer, a second outer electrode disposed in an area facing the inner electrode, of a surface of the second piezoelectric layer, a first low-permittivity portion having a permittivity lower than a permittivity of the first piezoelectric layer, and a second low-permittivity portion having a permittivity lower than a permittivity of the second piezoelectric layer. The drive unit generates a predetermined electric potential difference between the inner electrode and the first outer electrode.

16 Claims, 15 Drawing Sheets

(56) References Cited

U.S. PATENT DOCUMENTS 6,796,637 B2 * 9/2004 Kitagawa et al. ............... 347/68
7,527,363 B2 * 5/2009 Nagashima .................... 347/70
2002/0085065 A1 * 7/2002 Shimada et al. ............... 347/68
2005/0073557 A1  4/2005 Sugahara
2006/0082619 A1  4/2006 Yasui
2008/0079784 A1  4/2008 Sugahara

* cited by examiner

LIQUID DROPLET JETTING APPARATUS AND PIEZOELECTRIC ACTUATOR

CROSS REFERENCE TO RELATED APPLICATION

The present application claims priority from Japanese Patent Application No. 2012-081178, filed on Mar. 30, 2012, the disclosure of which is incorporated herein by reference in its entirety.

BACKGROUND OF THE INVENTION

1. Field of the Invention

The present invention relates to a liquid droplet jetting apparatus and a piezoelectric actuator.

2. Description of the Related Art

As an ink-jet head which jets an ink from nozzles, an ink-jet head described below has hitherto been known. The ink-jet head described below has a channel unit in which, a plurality of pressure chambers which communicate with a plurality of nozzles respectively is formed, and a piezoelectric actuator which applies pressure to the ink in the plurality of pressure chambers. The piezoelectric actuator has a vibration plate which covers the plurality of pressure chambers, a piezoelectric layer which is stacked on the vibration plate, and a plurality of upper electrodes which is formed on an opposite side of the vibration plate, sandwiching the piezoelectric layer. The plurality of upper electrodes faces central portions of the plurality of pressure chambers respectively. The vibration plate is kept at a ground electric potential, and also functions as a common electrode corresponding to the plurality of upper electrodes.

When a predetermined electric voltage is applied to a certain upper electrode, an electric field parallel to a direction of thickness acts on a portion of the piezoelectric layer, facing the central portion of the pressure chambers, and the portion of the piezoelectric layer contracts in a in-plane direction. Due to the contraction of the piezoelectric layer at the central portion of the pressure chamber, an overall portion, of the piezoelectric layer and the vibration plate, facing the pressure chamber is deformed to form a projection toward the pressure chamber. Accordingly, a volume inside the pressure chamber decreases, and a pressure is applied to the ink inside the pressure chamber.

SUMMARY OF THE INVENTION

In the abovementioned piezoelectric actuator, a portion facing an outer-edge portion of the pressure chamber, which is near an outer edge of the pressure chamber than the upper-portion electrode, is not deformed spontaneously as the electric field is not acting thereof. The portion facing the outer-edge portion is only deformed dependently, according to the contraction of the piezoelectric layer at the central portion of the pressure chamber. Therefore, it is necessary for the portion of the piezoelectric actuator facing the central portion of the pressure chamber to deform dependently a portion surrounding thereof. As a result, a deformation efficiency of the piezoelectric actuator is lowered. In other words, for deforming the piezoelectric actuator substantially for applying a substantial pressure to the ink inside the pressure chamber, it has been necessary to set the voltage to be applied to the upper electrode to be high.

An object of the present invention is to improve the deformation efficiency of the piezoelectric actuator.

According to a first aspect of the present teaching, there is provided a liquid droplet jetting apparatus which jets liquid droplets onto a medium, including a channel unit having liquid channels including a nozzle and a pressure chamber communicating with the nozzle formed therein;
  a piezoelectric actuator disposed on the channel unit to cover the pressure chamber; and
  a drive unit configured to drive the piezoelectric actuator, wherein the piezoelectric actuator includes:
  a first piezoelectric layer and a second piezoelectric layer which are stacked in a thickness direction thereof, and which cover the pressure chamber,
  an inner electrode disposed between the first piezoelectric layer and the second piezoelectric layer, facing the pressure chamber,
  a first outer electrode disposed in an area facing the inner electrode, of a surface of the first piezoelectric layer on an opposite side of the second piezoelectric layer,
  a second outer electrode disposed in an area facing the inner electrode, of a surface of the second piezoelectric layer on an opposite side of the first piezoelectric layer,
  a first low-permittivity portion having a permittivity lower than a permittivity of the first piezoelectric layer, which is disposed between the inner electrode and the first piezoelectric layer or between the first outer electrode and the first piezoelectric layer, facing a central portion of the pressure chamber, and
  a second low-permittivity portion having a permittivity lower than a permittivity of the second piezoelectric layer, which is disposed between the inner electrode and the second piezoelectric layer or between the second outer electrode and the second piezoelectric layer, facing a portion near an outer edge of the central portion of the pressure chamber, and
  the drive unit is configured to generate an electric potential difference between the inner electrode and the first outer electrode, and between the inner electrode and the second outer electrode.

As the predetermined electric potential difference is generated between the inner electrode and the first outer electrode and between the inner electrode and the second outer electrode of the piezoelectric actuator, a portion of the first piezoelectric layer sandwiched between the first outer electrode and the inner electrode and a portion of the second piezoelectric layer sandwiched between the second outer electrode and the inner electrode contract in a in-plane direction (a direction of plane). Here, in the present teaching, a low-permittivity portion having the permittivity lower than the permittivity of the piezoelectric layer exists between the inner electrode and the outer electrode. Therefore, when there is an electric potential difference between the two electrodes, a substantial part of a voltage applied is applied to the low permittivity portion, and a voltage applied to the piezoelectric layer sandwiched between the two electrodes becomes small. Consequently, each piezoelectric layer almost does not contract in an area in which the low-permittivity portion exist, and contracts only in an area in which the low-permittivity portion does not exist.

The first piezoelectric layer according to the present teaching, is provided with the first low-permittivity portion which is facing the central portion of the pressure chamber. Therefore, when an electric potential difference is developed between the inner electrode and the first outer electrode, an electric field necessary for contraction is generated in the portion of the first piezoelectric layer, facing the portion near the outer edge of the pressure chamber. Therefore, the portion of the first piezoelectric layer facing the portion near the outer edge of the pressure chamber contracts in the planar direction. On the other hand, the second piezoelectric layer is provided with a second low-permittivity portion facing the portion near the edge portion than the central portion of the pressure chamber. Consequently, when an electric potential difference is developed between the inner electrode and the second outer electrode, an electric field necessary for contraction is generated in the portion of the piezoelectric layer facing the central portion of the pressure chamber. Therefore, the portion of the second piezoelectric layer facing the central portion of the pressure chamber, contracts. Accordingly, the portion of the piezoelectric actuator facing the central portion of the pressure chamber and the portion of the piezoelectric actuator facing the portion near the outer edge of the pressure chamber are deformed in opposite directions. In such manner, when the electric potential difference is developed between the electrodes, by the portion of the piezoelectric actuator facing the portion near the outer edge of the pressure chamber being deformed spontaneously, a force constraining the deformation, which is exerted to the central portion from surrounding thereof is weakened. As a result, a deformation efficiency of the piezoelectric actuator becomes high. In other words, it is possible to deform the piezoelectric actuator substantially even by a small electric potential difference.

According to a second aspect of the present teaching, there is provided a piezoelectric actuator including,
  a first piezoelectric layer and a second piezoelectric layer which are stacked mutually;
  an inner electrode disposed between the first piezoelectric layer and the second piezoelectric layer;
  a first outer electrode disposed in an area facing the inner electrode, of a surface of the first piezoelectric layer on an opposite side of the second piezoelectric layer;
  a second outer electrode disposed in an area facing the inner electrode, of a surface of the second piezoelectric layer on an opposite side of the first piezoelectric layer;
  a first low-permittivity portion having a permittivity lower than a permittivity of the first piezoelectric layer, which is disposed between the inner electrode and the first piezoelectric layer or between the first outer electrode and the first piezoelectric layer, facing a central portion of the inner electrode; and
  a second low-permittivity portion having a permittivity lower than a permittivity of the second piezoelectric layer, which is disposed between the inner electrode and the second piezoelectric layer or between the second outer electrode and the second piezoelectric layer, facing a portion on an outer of the central portion of the inner electrode.

In the piezoelectric actuator according to the present teaching, when a predetermined electric potential difference is developed between the inner electrode and the first outer electrode and between the inner electrode and the second outer electrode, a portion of the first piezoelectric layer facing the portion near an outer edge of the inner electrode is deformed, and a portion of the second piezoelectric layer facing the central portion of the inner electrode is deformed. At this time, a portion of the piezoelectric actuator facing the central portion of the inner electrode and a portion of the piezoelectric actuator facing the portion near the outer edge of the inner electrode are deformed in opposite directions. Accordingly, even when the electric potential difference is small, it is possible to deform the piezoelectric actuator substantially, and a deformation efficiency of the piezoelectric actuator is improved.

DETAILED DESCRIPTION OF THE PREFERRED EMBODIMENTS

Figure 1:
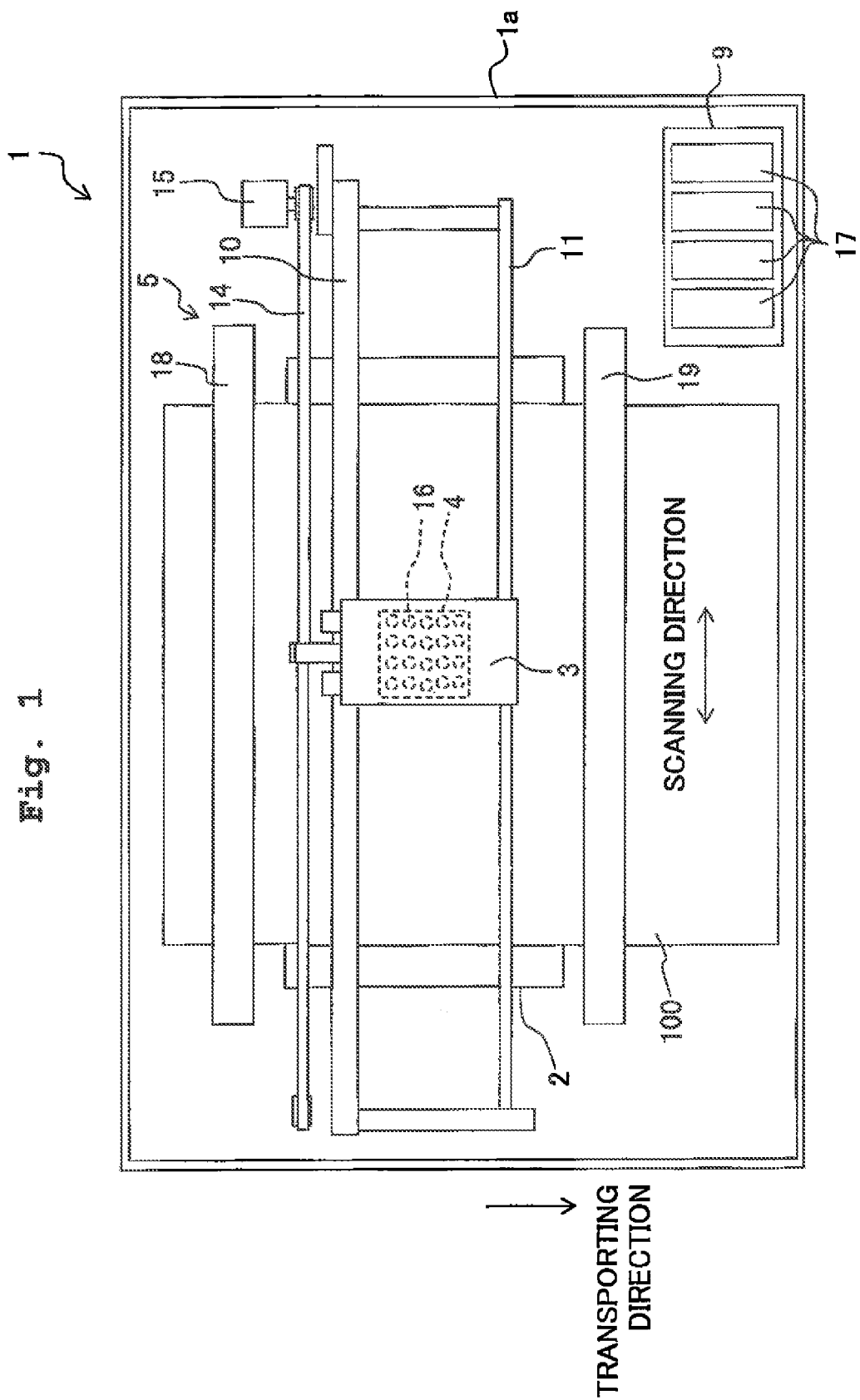
FIG. 1 is a schematic plan view of an ink-jet printer according to an embodiment.

An embodiment of the present teaching will be described below. A schematic structure of an ink-jet printer 1 will be described below by referring to FIG. 1. In the explanation described below, a frontward side of a paper surface is defined as an upper side and a rearward side of the paper surface is defined as a lower side, and the terms 'upward (up)' and 'downward (down)' are used for specifying the directions, as appropriate. As shown in FIG. 1, the ink-jet printer 1 includes components such as a platen 2, a carriage 3, an ink-jet head 4, and a transporting mechanism 5.

A recording paper 100 which is a recording medium is placed on an upper surface of the platen 2. At an upper side of the platen 2, two guide rails 10 and 11 which are extended parallel to a scanning direction in FIG. 1 are provided. The carriage 3 is arranged to be reciprocatable in the scanning direction along the two guide rails 10 and 11 in an area facing the platen 2. Moreover, an endless belt 14 is connected to the carriage 3. The carriage moves in the scanning direction by the endless belt 14 which is driven to turn by a carriage drive motor 15.

The ink-jet head 4 is installed on the carriage 3, and moves in the scanning direction together with the carriage 3. A lower surface (a surface on a rear side of paper surface in FIG. 1) of the ink-jet head 4 is a liquid droplet jetting surface in which a plurality of nozzles 16 is formed. Moreover, as shown in FIG.

1, a holder 9 is provided to a main-body 1a of the printer 1. Four ink cartridges 17 storing inks of four colors (black, yellow, cyan, and magenta) respectively are installed on the holder 9. Moreover, although it is not shown in the diagram, the holder 9 and the ink-jet head 4 installed on the carriage 3 are connected by four tubes (not shown in the diagram). The inks of four colors from the four ink cartridges 17 are supplied to the ink-jet head 4 via the four tubes. The ink-jet head 4 jets the inks of four colors onto the recording paper 100 placed on the platen 2, from the plurality of nozzles 16.

The transporting mechanism 5 has two transporting rollers 18 and 19 arranged so that the platen 2 is intervened therebetween in a transporting direction. The two transporting rollers 18 and 19 are driven and rotated by respective motors which are not shown in the diagram. The transporting mechanism 5 transports the recording paper 100 placed on the platen 2 in the transporting direction by the two transporting rollers 18 and 19.

The ink-jet printer 1 jets the ink on to the recording paper 100 placed on the platen 2, from the ink-jet head 4 which reciprocates in the scanning direction together with the carriage 3. In conjunction with the jetting of the ink, the ink-jet printer 1 transports the paper in the transporting direction by the two transporting rollers 18 and 19. Due to the abovementioned operation, an image and characters etc. are recorded on the recording paper 100.

Figure 2:
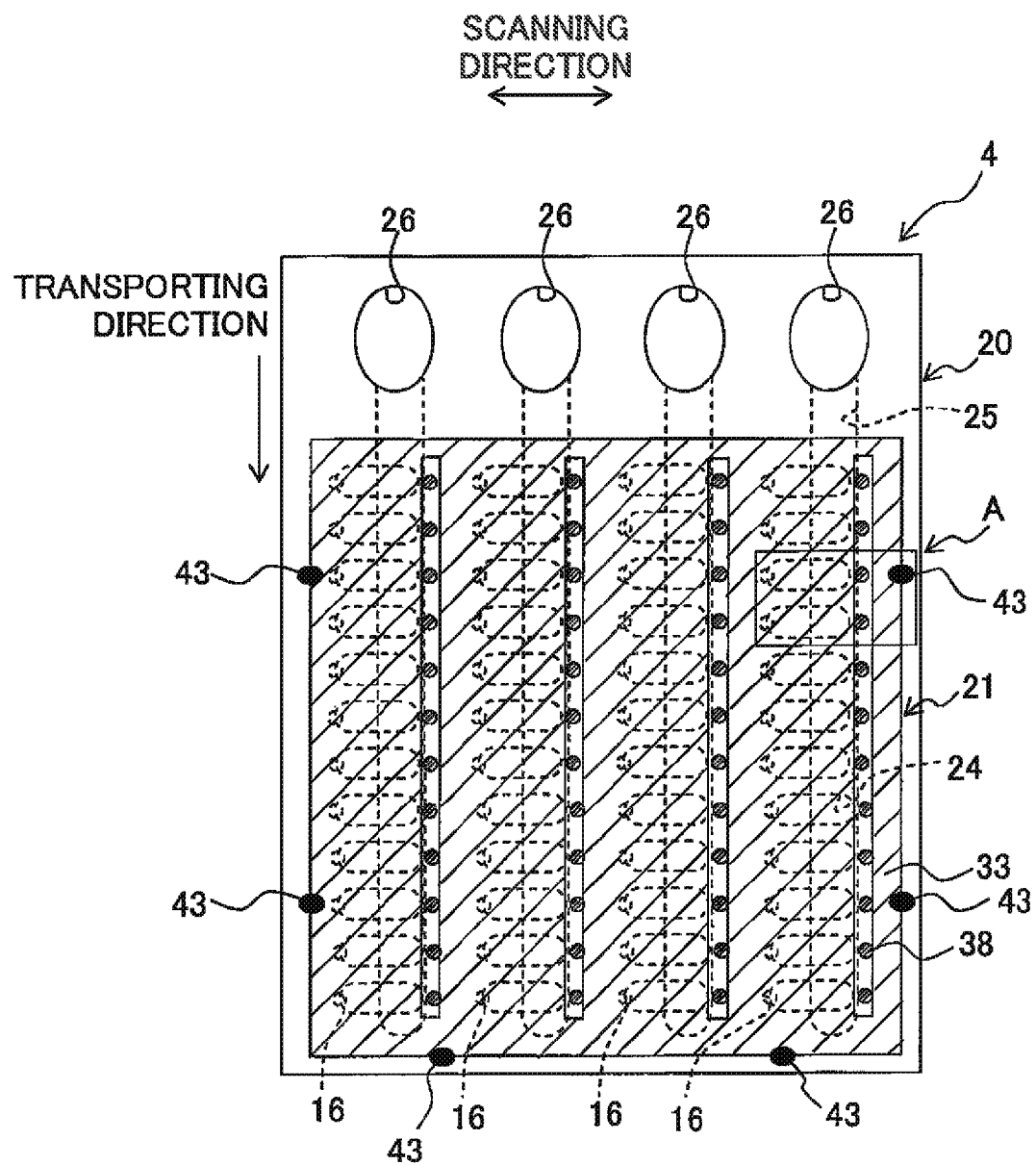
FIG. 2 is a plan view of an ink-jet head.
Figure 3:
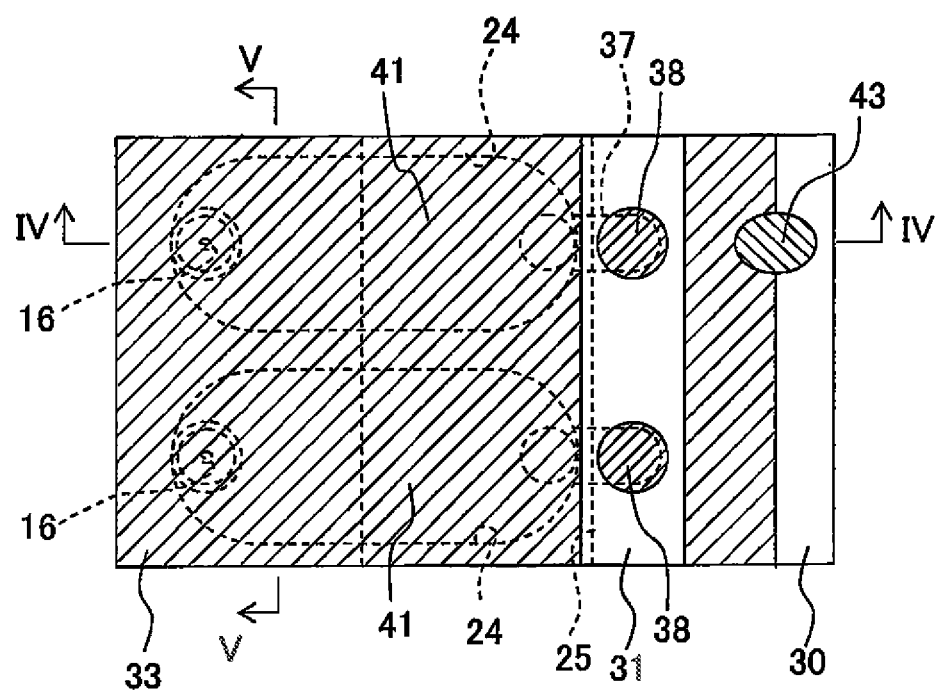
FIG. 3 is an enlarged view of portion A in FIG. 2.
Figure 4:
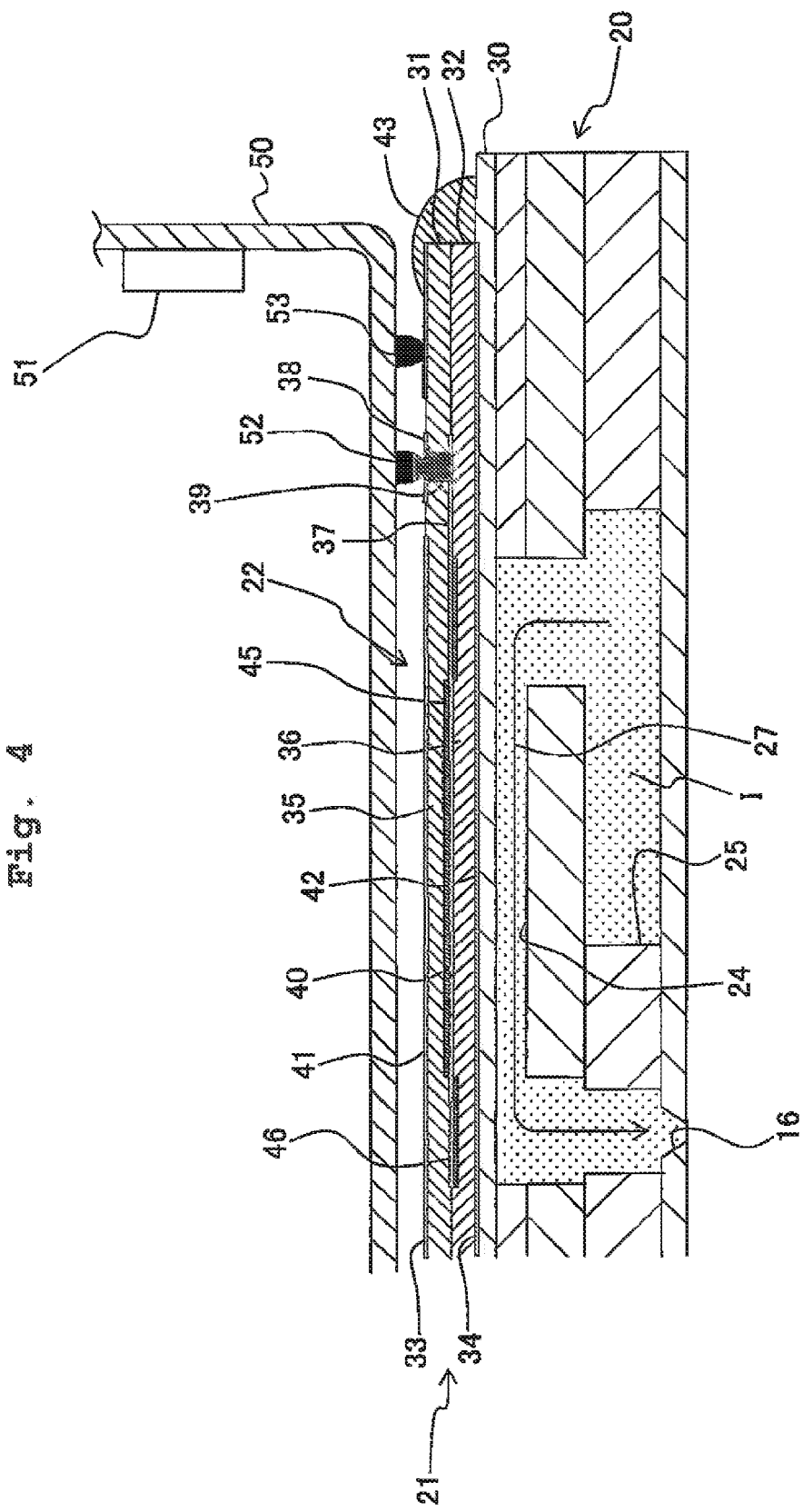
FIG. 4 is a cross-sectional view along a line IV-IV in FIG. 3.
Figure 5:
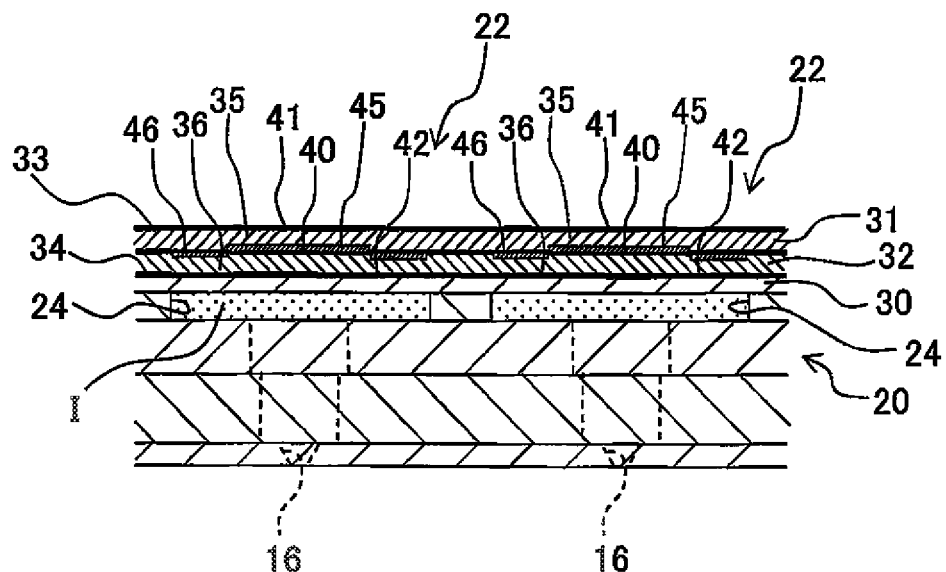
FIG. 5 is a cross-sectional view along a line V-V in FIG. 3.

Next, the ink-jet head 4 will be described below. In FIGS. 2, 3, and 5, a COF 50 shown in FIG. 4 is omitted. In FIGS. 2, 3, 4, and 5, the ink-jet head 4 includes a channel unit 20, and an actuator unit 21.

As shown in FIG. 4, the channel unit 20 has stacked four metallic plates in which a plurality of channel forming holes is formed. The plurality of channel forming holes communicate with each other when the four plates are stacked, and thereby ink channels as mentioned below are formed in the channel unit 20 In FIGS. 4 and 5, an ink filled in the ink channel is denoted by a reference numeral 'I'.

At an interior of the channel unit 20, four manifolds 25, each extended in the transporting direction, are formed. The four manifolds 25 are connected to four ink supply holes 26 which are formed in an upper surface of the channel unit 20. The inks of four colors (black, yellow, cyan, and magenta) from the four ink cartridges 17 shown in FIG. 1 are supplied to the four ink supply holes 26 respectively.

The channel unit 20 has the plurality of nozzles 16 formed in the lower surface thereof, and a plurality of pressure chambers 24 which communicates with the plurality of nozzles 16. Each of the plurality of pressure chambers 24 has an elliptical shape in a plane view. As shown in FIG. 2, the plurality of nozzles 16 and the plurality of pressure chambers 24 are arranged in four rows corresponding to the manifolds 25 for the four colors. Moreover, as shown in FIG. 4, each pressure chamber 24 communicates with the corresponding manifold 25. Accordingly, a plurality of individual ink channels 27 each of which is branched from the manifold 25 and reach one of the nozzle 16 via one of the pressure chamber 24 is formed in the channel unit 20.

Next, the actuator unit 21 will be described below. The actuator unit 21 is arranged on the upper surface of the channel unit 20. The actuator unit 21 has a plurality of piezoelectric actuators 22 arranged to cover the plurality of pressure chambers 24 respectively. The plurality of piezoelectric actuators 22 is integrated, and the actuator unit 21 has a flat-plate shape extended to be spreading over the plurality of pressure chambers 24.

A structure of the actuator unit 21 will be described below in detail. As shown in FIGS. 4 and 5, the actuator unit 21 includes an ink separating film 30, a first piezoelectric sheet 31, a second piezoelectric sheet 32, a plurality of inner electrodes 40, a first common electrode 33, and a second common electrode 34.

The ink separating film 30 is arranged on the upper surface of the channel unit 20 to cover the plurality of pressure chambers 24. The ink separating film 30 is provided for preventing the ink in the pressure chamber 24 from entering into the first piezoelectric sheet 31 and the second piezoelectric sheet 32. Accordingly, the ink separating film 30 is formed of a material through which the ink cannot pass, such as a metallic material. Although it is not shown in the diagram, in a case in which the ink separating film 30 is formed of an electroconductive material such as a metallic material, an insulating layer may be provided between the ink separating film 30 and the second common electrode 34 which will be described later. Or, the ink separating film 30 may also serve as the second common electrode 34.

The first piezoelectric sheet 31 and the second piezoelectric sheet 32 are arranged on an upper surface of the ink separating film 30, to be spread over the plurality of pressure chambers 24. Moreover, the first piezoelectric sheet 31 and the second piezoelectric sheet 32 are stacked in order of the second piezoelectric sheet 32 and the first piezoelectric sheet 31, from a side of the channel unit 20. Each of the first piezoelectric sheet 31 and the second piezoelectric sheet 32 is made of a piezoelectric material having ferroelectric lead zirconate titanate (PZT) which is a solid solution of lead titanate and lead zirconate, as a principal component. In the following description, a portion of the first piezoelectric sheet 31 covering each pressure chamber 24 will be called as a 'first piezoelectric layer 35', and a portion of the second piezoelectric sheet 32 covering each pressure chamber 24 will be called as a 'second piezoelectric layer 36'. In other words, the plurality of first piezoelectric layers 35 corresponding to the plurality of pressure chambers 24 respectively is formed integrally, and thereby the first piezoelectric sheet 31 is formed. Similarly, the plurality of second piezoelectric layers 36 corresponding to the plurality of pressure chambers 24 respectively is formed integrally, and thereby the second piezoelectric sheet 32 is formed.

Figure 6:
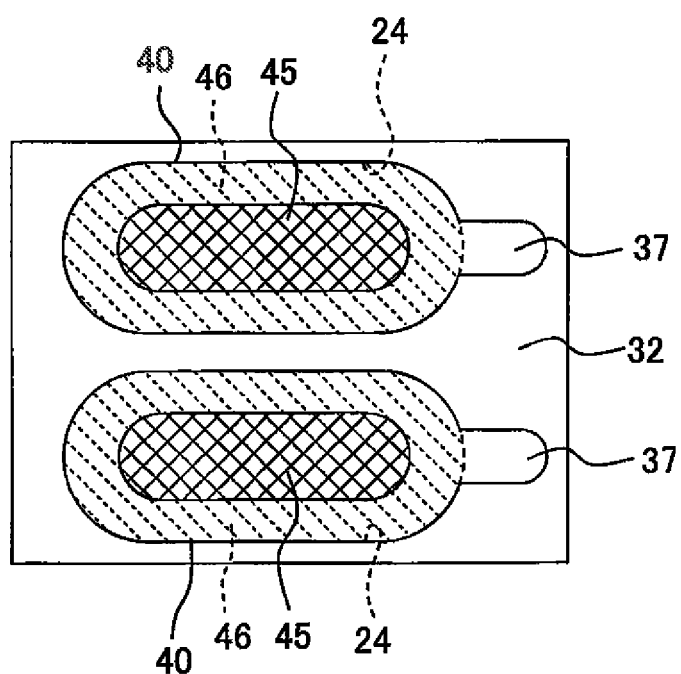
FIG. 6 is a top view of a second piezoelectric layer which is a lower layer, of a piezoelectric actuator in FIG. 3.

Each of the plurality of inner electrodes 40 is arranged to face the pressure chamber 24, between the first piezoelectric layer 35 and the second piezoelectric layer 36. FIG. 6 is a diagram in which the first piezoelectric sheet 31 which is an upper layer in FIG. 3 is omitted. As shown in FIGS. 4, 5, and 6, the inner electrode 40 has an elliptical shape in a plane view almost same as the shape of the corresponding pressure chamber 24, and faces almost the entire area of the pressure chamber 24. As shown in FIGS. 4 and 6, a drawn portion 37 which is drawn from the inner electrode 40 up to an outer of the pressure chamber 24 is connected to the inner electrode 40. A connecting terminal 38 which is to be connected to a driver IC which will be described later is formed on an upper surface of a portion of the first piezoelectric sheet 31 which covers a front-end portion of the drawn portion 37. Moreover, the drawn portion 37 and the connecting terminal 38 are brought into conduction by an electroconductive material which has been filled in a through hole 39 formed in the first piezoelectric sheet 31. As it has been described above, the inner electrode 40 arranged between the first piezoelectric layer 35 and the second piezoelectric layer 36, and the connecting terminal 38 formed on the upper surface of the first piezoelectric layer 35 are connected electrically by the drawn portion 37 and the electroconductive material which has been filled in the through hole 39.

The first common electrode 33 is formed on almost entire area of the upper surface of the first piezoelectric sheet 31, which is a surface on an opposite side of the second piezoelectric sheet 32. The second common electrode 34 is formed on almost entire area of a lower surface of the second piezoelectric sheet 32, which is a surface on an opposite side of the first piezoelectric sheet 31. In the following description, a portion of the first common electrode 33, facing each pressure chamber 24 will be called as a 'first outer electrode 41', and a portion of the second common electrode 34, facing each pressure chamber 24 will be called as a 'second outer electrode 42'. In other words, the first common electrode 33 is formed by the plurality of first outer electrodes 41 corresponding to the plurality of pressure chambers 24 respectively being brought into mutual conduction. Similarly, the second common electrode 34 is formed by the plurality of second outer electrodes 42 corresponding to the plurality of pressure chambers 24 respectively being brought into mutual conduction. As shown in FIGS. 2, 3, and 4, the first common electrode 33 and the second common electrode 34 are in mutual conduction by a plurality of electrode connecting portions 43 formed by an electroconductive paste on a side surface of each of the first piezoelectric sheet 31 and the second piezoelectric sheet 32.

Moreover, the first piezoelectric layer 35, the second piezoelectric layer 36, the inner electrode 40, the first outer electrode 41, and the second outer electrode 42 provided for a certain pressure chamber 24, form one piezoelectric actuator 22 which applies a pressure to the ink inside this pressure chamber 24. In each piezoelectric actuator 22, the first piezoelectric layer 35 sandwiched between the inner electrode 40 and the first outer electrode 41 is polarized in a direction of thickness thereof. Similarly, the second piezoelectric layer 36 sandwiched between the inner electrode 40 and the second outer electrode 42 is polarized in a direction of thickness thereof.

The COF 50 (Chip On Film) which is a flexible wire member is arranged at an upper side the piezoelectric actuator 22, and a driver IC 51 which drives the piezoelectric actuator 22 is mounted on the COF 50. The COF 50 is electrically connected to the first common electrode 33 and the connecting terminal 38 for the inner electrode 40 formed on an upper surface of the piezoelectric actuator 22, by bumps 52 and 53.

The driver IC 51 is connected to the inner electrodes 40 of the plurality of piezoelectric actuators 22 via drive wires (not shown in the diagram) on the COF 50. Moreover, the COF 50 is also connected to a control substrate (not shown in the diagram) of the ink-jet printer 1. The driver IC 51 receives a command from the control substrate, and outputs a predetermined drive signal selectively to the inner electrodes 40 of the plurality of piezoelectric actuators 22. In other words, the inner electrode 40 of each piezoelectric actuator 22 is a drive electrode to which a drive signal is applied from the driver IC 51.

In the embodiment, the description will be made assuming that a pulse signal of a rectangular wave having a predetermined peak voltage V0 is applied to the drive electrode. However, the drive signal of the present teaching is not restricted to the pulse signal of a rectangular wave, and a signal other than the rectangular wave may be used. Details of the drive signal will be described later. On the other hand, the first common electrode 33 and the second common electrode 34 are electrodes to be kept on a predetermined constant voltage Vcom. In the embodiment, the description will be made assuming that the first common electrode 33 and the second common electrode 34 are ground electrodes which are connected to a ground wire (not shown in the diagram) on the COF 50. In other words, in the embodiment, Vcom=0 V. As it has been mentioned above, the first common electrode 33 and the second common electrode 34 are in mutual conduction by the plurality of electrode connecting portions 43.

As the drive signal is applied to the inner electrode 40 of the piezoelectric actuator 22, a predetermined electric potential difference (such as V0) is developed between the inner electrode 40 and the first outer electrode 41, and between the inner electrode 40 and the second outer electrode 42. Accordingly, an electric field corresponding to a voltage of the drive signal is applied to each of the first piezoelectric layer 35 and the second piezoelectric layer 36. Moreover, as it has been mentioned above, each of the first piezoelectric layer 35 and the second piezoelectric layer 36 is polarized in the direction of thickness. In other words, since a direction in which the electric field acts and the direction in which the piezoelectric layers are polarized are same, each of the first piezoelectric layer 35 and the second piezoelectric layer 36 is extended in the direction of thickness and contracts in a planar direction.

Incidentally, in the embodiment, as shown in FIGS. 4 and 5, in each piezoelectric actuator 22, each of the inner electrode 40, first outer electrode 41 and the second outer electrode 42 faces an entire area of the pressure chamber 24. Only with the abovementioned arrangement, when an electric potential difference is developed between the inner electrode 40 and the first outer electrode and between the inner electrode 40 and the second outer electrode 42, the first piezoelectric layer 35 and the second piezoelectric layer 36 contract in the planar direction, throughout the entire area of the pressure chamber 24. Consequently, a difference in an amount of contraction between the first piezoelectric layer 35 and the second piezoelectric layer 36 being small, bending of the piezoelectric actuator 22 becomes small, and deformation in a direction orthogonal to the planar direction of the first piezoelectric layer 35 and the second piezoelectric layer 36 also becomes small.

In the embodiment, the piezoelectric actuator 22 is arranged such that a different portion of the first piezoelectric layer 35 and the second piezoelectric layer 36 is deformed in the planar direction. As shown in FIGS. 4, 5, 6, and 7, a first low-permittivity portion 45 having a permittivity lower than a permittivity of the first piezoelectric layer 35 is provided between the inner electrode 40 and the first piezoelectric layer 35. Moreover, a second low-permittivity portion 46 having a permittivity lower than a permittivity of the second piezoelectric layer 36 is provided between the inner electrode 40 and the second piezoelectric layer 36.

Each of the first low-permittivity portion 45 and the second low-permittivity portion 46 is formed of a material having a permittivity (dielectric constant) lower than a permittivity of PZT forming the first piezoelectric layer 35 and the second piezoelectric layer 36. A relative permittivity (specific permittivity) of PZT in general, is in a range of 1200 to 1400, whereas, it is possible to form by a ceramics material such as alumina (relative permittivity 8~11) and zirconia (relative permittivity 46) having a significantly low relative permittivity. The relative permittivity (specific permittivity) is a ratio of a permittivity of a substance to a permittivity of vacuum ($8.85 \times 10^{-12}$ F/m).

The first low-permittivity portion 45 has an elliptical shape slightly smaller than the inner electrode 40. As shown in FIG. 6, the first low-permittivity portion 45 is arranged between the inner electrode 40 and the first piezoelectric layer 35, facing a central portion of the pressure chamber 24. On the other hand, the second low-permittivity portion 46 is arranged between the inner electrode 40 and the second piezoelectric layer 36, facing an outer-edge portion of the pressure chamber 24, which is nearer to an outer edge than the central portion of the pressure chamber 24. Moreover, the second low-permittivity portion 46 is formed to be ring-shaped along the outer edge of the pressure chamber 24, and is arranged to be enclosing the first low-permittivity portion 45. In the following description, a portion of the first piezoelectric layer 35, facing the central portion of the pressure chamber 24 is called as a 'central portion 35a', and a portion of the first piezoelectric layer 35, facing the outer-edge portion of the pressure chamber 24 is called as an 'outer-edge portion 35b'. Similarly, respective portions of the second piezoelectric layer 36 are called as a 'central portion 36a' and an 'outer-edge portion 36b'.

Figure 7:
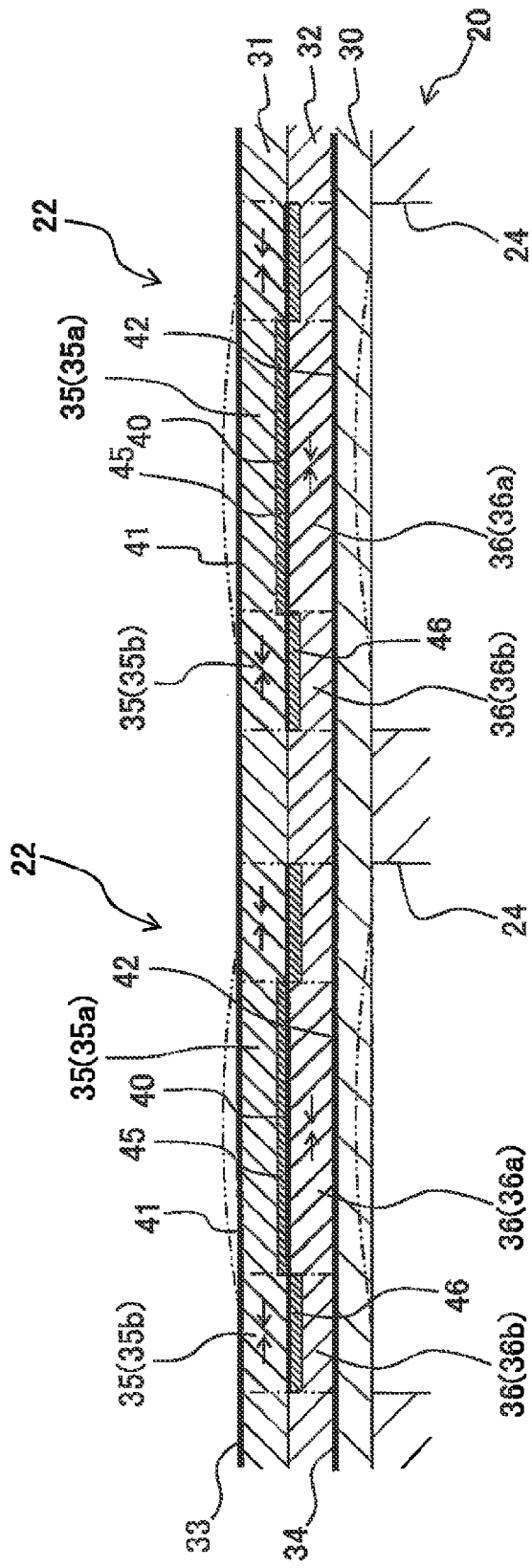
FIG. 7 is an enlarged view of the piezoelectric actuator in FIG. 5.

In FIGS. 6 and 7, when viewed from top, the ring-shaped second low-permittivity portion 46 is arranged such that, an inner edge thereof makes a contact with an outer edge of the first low-permittivity portion 45, at an immediate outer of the first low-permittivity portion 45. However, the first low-permittivity portion 45 and the second low-permittivity portion 46 may overlap partially when viewed from top. Or, there may be a gap between the first low-permittivity portion 45 and the second low-permittivity portion 46. In other words, it is preferable that at least a part of the second low-permittivity portion 46 exists in an area on an outer of the first low-permittivity portion 45. In the present teaching, there is no problem whether a part of both the first low-permittivity portion 45 and the second low-permittivity portion 46 overlap, or the first low-permittivity portion 45 and the second low-permittivity portion 46 are arranged to have a gap therebetween.

When the first low-permittivity portion 45 and the second low-permittivity portion 46 having a permittivity lower than the permittivity of the first piezoelectric layer 35 and the permittivity of the second piezoelectric layer 36 exist between the inner electrode 40 and the first outer electrode 41 and the second outer electrode 42, a substantial portion of a voltage applied is applied to the first low-permittivity portion 45 and the second low-permittivity portion 46, and a voltage applied to the first piezoelectric layer 35 and the second piezoelectric layer 36 becomes small.

This will be described below in detail. An equivalent circuit of the first piezoelectric layer 35, which has been provided with the first low-permittivity portion 45 shown in FIG. 8 includes, a condenser 55 having a capacitance C1, a condenser 56 having a capacitance C2, and a condenser 57 having a capacitance C3. The condenser 56 and the condenser 57 are connected in series. Moreover, the condenser 56 and the condenser 57, and the condenser 55 are connected in parallel.

An electrostatic capacitance formed by a stacked body of the central portion 35a and the first low-permittivity portion 45, the inner electrode 40 and the first outer electrode 41 is equivalent to an electrostatic capacitance of a circuit in which the condenser 56 and the condenser 57 are connected in series. Moreover, an electrostatic capacitance formed by the outer-edge portion 35b, and the inner electrode 40 and the first outer electrode 41 is equivalent to an electrostatic capacitance of the condenser 55. It is possible to express an electrostatic capacitance of the condenser 55 by C1=∈1×S1/d1, an electrostatic capacitance of the condenser 56 by C2=∈1×S2/d2, and an electrostatic capacitance of the condenser 57 by C3=∈2×S2/d3. "∈1" is a permittivity of the first piezoelectric layer 35. "∈2" is a permittivity of the first low-permittivity portion 45. "S1" is an area of the outer-edge portion 35b. S2 is an area of the central portion 35a. "d1" is a thickness of the outer-edge portion 35b. "d2" is a thickness of the central portion 35a. "d3" is a thickness of the first low-permittivity portion 45.

Here, the electric potential difference V0 is developed between the inner electrode 40 and the first outer electrode 41 shown in FIG. 7, a voltage V1 applied to the outer-edge portion 35b, a voltage V2 is applied to the central portion 35a, and a voltage V3 is applied to the first low-permittivity portion 45. On the other hand, when a voltage of an electromotive force V0 is applied to an equivalent circuit in FIG. 8, a voltage applied to the condenser 55 becomes V1 which is same as a voltage applied to the outer-edge portion 35b. Moreover, a voltage applied to the condenser 56 becomes V2 which is same as a voltage applied to the central portion 35a. Moreover, a voltage applied to the condenser 57 becomes V3 which is same as a voltage applied to the first low-permittivity portion 45. The voltage applied to the condenser 55 is equivalent to the electromotive force V0.

An electrostatic capacitance of a condenser is proportional to a permittivity of an insulator which is sandwiched between two electrodes, and is inversely proportional to a thickness of the insulator. Moreover, the permittivity ∈1 of the first piezoelectric layer 35 made of PZT is substantially higher than the permittivity ∈2 of the first low-permittivity portion 45, and is 100 times or more in the example cited above. According to findings of inventors of the present invention, it is preferable that a magnitude of the permittivity ∈1 of the first piezoelectric layer 35 and the second piezoelectric layer 36 is not less than approximately 50 times of the permittivity ∈2 of the first low-permittivity portion 45 and the second low-permittivity portion 46. On the other hand, the thickness d2 of the central portion 35a is about ten times of the thickness d3 of the first low-permittivity portion 45. Moreover, the area S1 of the outer-edge portion 35b and the area S2 of the central portion 35a are almost equivalent. In this case, a relationship of the capacitance C1 of the condenser and the capacitance C2 of the condenser becomes C2>C3.

Figure 8:
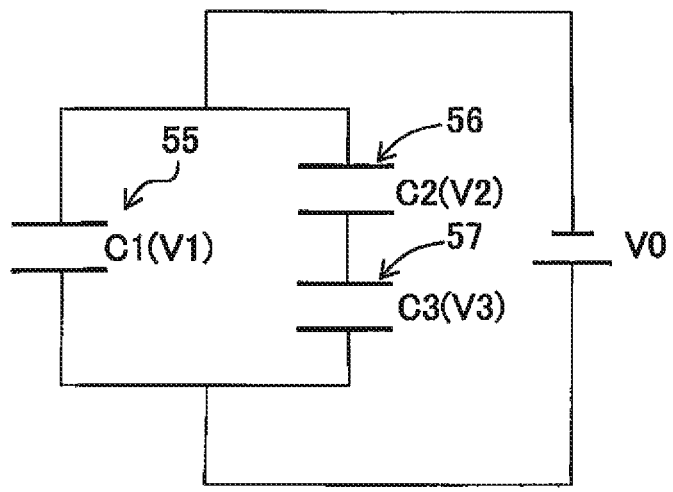
FIG. 8 is an equivalent circuit diagram of a first piezoelectric layer provided with a first low-permittivity portion.

When the voltage V0 is applied to the equivalent circuit in FIG. 8, the voltage V0 is divided into the two types of condensers 56 and 57 having the capacitance C2 and C3, respectively. Here, in a series circuit of the condensers, since the voltage applied to each condenser is inversely proportional to the capacitance, a substantial part of the voltage V0 is applied to the condenser 57 having the small capacitance C3, and almost no electric potential difference is generated in the condenser 56 having the high capacitance C2. In other words, a relationship of V2 and V3 becomes V2<V3.

In other words, in a case in which the predetermined electric potential difference V0 is developed between the inner electrode 40 and the first outer electrode 41, almost no electric field acts on the central portion 35a which is provided with the first low-permittivity portion 45, and contraction in the planar direction hardly occurs. In other words, as shown in FIG. 7, in the first piezoelectric layer 35, almost only the outer-edge portion 35b contracts. Whereas, in the second piezoelectric layer 36, contraction of the outer-edge portion 36b in which the second low-permittivity portion 46 exists hardly occurs, and almost only the central portion 36a is deformed.

Figure 9:
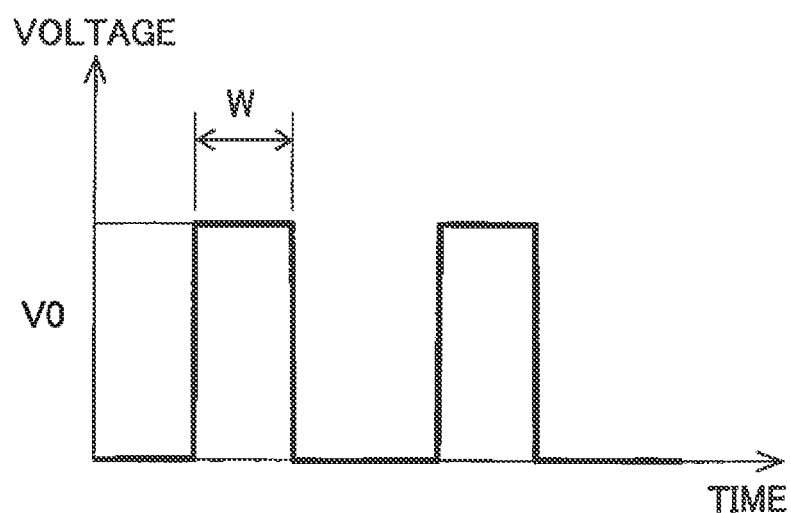
FIG. 9 is a diagram showing a pulse waveform of a drive signal supplied to the piezoelectric actuator from a driver IC.

FIG. 9 is a diagram showing a pulse waveform of a drive signal which is supplied to the piezoelectric actuator 22 from the driver IC 51. In the piezoelectric actuator 22 of the embodiment, a driving method called as 'pulling ejection' in which a pressure is applied to the ink inside the pressure chamber 24 by decreasing a volume inside the pressure chamber 24 after elapsing of a predetermined time upon increasing the volume inside the pressure chamber 24 once, is adopted.

The driver IC 51 applies a drive signal having a pulse waveform as shown in FIG. 9 to each of the plurality of inner electrodes 40 of the piezoelectric actuator 22. As a pulse of voltage V0 is applied to the inner electrode 40, the central portion 36a of the second piezoelectric layer 36 on a lower side contracts in the planar direction. Whereas, the central portion 35a of the first piezoelectric layer 35 positioned above this (the second piezoelectric layer 36) almost does not contract. Due to a difference in an amount of contraction of the upper layer and the lower layer, a central portion of the piezoelectric actuator 22 contracts to form a projection upward, or in other words, to form a projection on an opposite side of the channel unit 20, as shown by an alternate long and two short dashes line in FIG. 7. Accordingly, the entire piezoelectric actuator 22 bends to form a projection upward. At this time, since the volume of the pressure chamber 24 increases once, a negative pressure wave is generated inside the pressure chamber 24.

Incidentally, the negative pressure wave generated inside the pressure chamber 24 is propagated toward the manifold 25, but returns once again to the pressure chamber 24 as a positive pressure wave upon being reflected (reverberated) due to inversion of positive and negative at a connecting portion of the manifold 25 and the individual ink channel 27 in FIG. 4. Moreover, a width W of one pulse of the drive signal is set such that the width W becomes equivalent to a time till the negative pressure wave generated inside the pressure chamber 24 returns upon being inverted to positive pressure wave.

At the termination of the pulse in FIG. 9, or in other words, at a position of an edge of trailing of the pulse, applying of voltage V0 is terminated. At this time, since the piezoelectric actuator 22 regains original flat shape and the volume of the pressure chamber 24 decreases, a positive pressure wave is generated inside the pressure chamber 24. Here, when the width W of the pulse is set as mentioned above, at a timing at which the negative pressure wave which has been developed before is inverted to a positive pressure wave, and returns to the pressure chamber 24, a new positive pressure wave is generated inside the pressure chamber 24. Therefore, the positive pressure waves of two types are superimposed. Consequently, a substantial pressure is applied to the ink inside the pressure chamber 24, and the ink is jetted from the nozzle 16. In this pulling ejection, by superimposing the pressure waves, it is possible to apply the pressure to the ink inside the pressure chamber 24 effectively at a low voltage V0.

Here, at the time of applying the voltage V0, the central portion 36a of the second piezoelectric layer 36 on the lower side contracts, whereas, the outer-edge portion 35b of the piezoelectric layer 35 on the upper side contracts in the planar direction. Therefore, an outer-edge portion of the piezoelectric actuator 22 is deformed in a direction opposite to the direction in which the central portion is deformed, or in other words, the outer-edge portion of the piezoelectric actuator 22 is deformed to form a projection downward. In such manner, since the outer-edge portion of the piezoelectric actuator 22 is deformed spontaneously, a force constraining the deformation, which is exerted to the central portion of the piezoelectric actuator 22 from surrounding thereof is weakened. As a result, the central portion of the piezoelectric actuator 22 is susceptible to be deformed upward substantially. In other words, a deformation efficiency of the piezoelectric actuator 22 becomes high, and it is possible to realize a substantial deformation of the piezoelectric actuator 22 with a low voltage, or in other words, to realize a significant change in the volume of the pressure chamber 24. In other words, the piezoelectric actuator 22 according to the embodiment is deformed by a smaller potential difference as compared to a potential difference in the conventional arrangement. Consequently, it is possible to set low a peak voltage V0 of a drive signal which is applied to the inner electrode, and to suppress an electric power consumption.

In the embodiment, the first low-permittivity portion 45 and the second low-permittivity portion 46 are arranged between the inner electrode 40 and the first piezoelectric layer 35, and between the inner electrode 40 and the second piezoelectric layer 36. In other words, the first low-permittivity portion 45 and the second low-permittivity portion 46 are arranged between the first piezoelectric layer 35 and the second piezoelectric layer 36, together with the inner electrode 40. Such an arrangement has the following advantages as compared to a case in which the first low-permittivity portion 45 and the second low-permittivity portion 46 are arranged at an outer-surface side of the first piezoelectric layer 35 and the second piezoelectric layer 36, as in FIG. 19 which will be described later.

Since the permittivity of the first low-permittivity portion 45 and the second low-permittivity portion 46 is different from the permittivity of the first piezoelectric layer 35 and the second piezoelectric layer 36, mechanical characteristics such as an elasticity modulus and stiffness (hardness) of the first low-permittivity portion 45 and the second low-permittivity portion 46 also differ. Therefore, at the time of connecting the COF 50, when a force acts on a portion of the piezoelectric actuator 22 including the first low-permittivity portion 45 and the second low-permittivity portion 46, due to the difference in characteristics of the first low-permittivity portion 45 and the second low-permittivity portion 46, and the first piezoelectric layer 35 and the second piezoelectric layer 36, there is a possibility of a damage such as a crack etc. be caused to the first piezoelectric layer 35 and the second piezoelectric layer 36 which are in contact with the first low-permittivity portion 45 and the second low-permittivity portion 46. Regarding the abovementioned point, when the first low-permittivity portion 45 and the second low-permittivity portion 46 are arranged between the first piezoelectric layer 35 and the second piezoelectric layer 36, in a case in which an external force acts on the piezoelectric actuator 22, the external force hardly acts on the portions to which the first low-permittivity portion 45 and the second low-permittivity portion 46 are provided. Moreover, in a case in which the piezoelectric actuator 22 is bent during driving, a bending stress of an inner portion of each of the first piezoelectric layer 35 and the second piezoelectric layer 36 is smaller as compared to a bending stress of an outer-surface side portion. Therefore, even in such a case, a substantial stress hardly acts on the portions to which the first low-permittivity portion 45 and the second low-permittivity portion 46 are provided. Since the force hardly acts on the portions to which the first low-permittivity portion 45 and the second low-permittivity portion 46 are provided, a damage of the first piezoelectric layer 35 and the second piezoelectric layer 36 is suppressed.

Moreover, in the embodiment, the first piezoelectric layers 35 of the plurality of piezoelectric actuators 22 is arranged integrally, and thereby forms the first piezoelectric sheet 31. Moreover, the second piezoelectric layers 36 of the plurality of piezoelectric actuators 22 is arranged integrally, and thereby forms the second piezoelectric sheet 32. In such an arrangement, there is a possibility of occurrence of a so-called cross-talk in which contraction of the first piezoelectric layer 35 and the second piezoelectric layer 36 for a certain pressure chamber 24 is propagated to an adjacent pressure chamber 24. In other words, when the piezoelectric actuator 22 has deformed to form a projection upward for a certain pressure chamber 24, a portion of the first piezoelectric layer 35 and the second piezoelectric layer 36 joined to a side-wall portion of this pressure chamber 24 is inclined caused by the deformation. Accordingly, the piezoelectric actuator 22 in an adjacent pressure chamber 24 is deformed downward inversely. Therefore, when the two adjacent piezoelectric actuators 22 are driven simultaneously, an amount of deformation of each of the two adjacent piezoelectric actuators 22 becomes small. Regarding the abovementioned point, in the embodiment, since the outer-edge portion 35b of the first piezoelectric layer 35 is contracted, the outer-edge portion of the piezoelectric actuator 22 is deformed spontaneously. Therefore, the deformation of the piezoelectric actuator 22 is hardly propagated between the two adjacent pressure chambers 24, and the cross-talk can be suppressed.

In the piezoelectric actuator 22 according to the embodiment, the outer-edge portion 35b contracts in the first piezoelectric layer 35 which is the upper layer, and the central portion 36a contracts in the second piezoelectric layer 36 which is the lower layer. Therefore, when a drive signal is applied, the piezoelectric actuator 22 as a whole is deformed to form a projection on an opposite side of the channel unit 20 as shown in FIG. 7. In a case of adopting the abovementioned pulling ejection in the piezoelectric actuator 22 which is operated in such manner, as it is understood from the pulse waveform in FIG. 9, the voltage V0 is applied to the inner electrode 40 only in the width W of the pulse applying pressure to the ink. In other words, in a stand-by state in which the piezoelectric actuator 22 is not driven, the voltage V0 is not applied to the inner electrode 40, and the electric field does not act on the first piezoelectric layer 35 and the second piezoelectric layer 36. In such manner, since the time for which the electric field acts on the first piezoelectric layer 35 and the second piezoelectric layer 36 becomes short, degradation of the piezoelectric actuator 22 with the lapse of time is suppressed, and a life of the piezoelectric actuator 22 becomes longer.

From a point of view of making the electric field act on the first piezoelectric layer 35 and the second piezoelectric layer 36, the inner electrode 40 and both of the first outer electrode 41 and the second outer electrode 42 may be drive electrodes to which a drive signal is applied. However, in the embodiment, in particular, the inner electrode 40 is the drive electrode, and the first outer electrode 41 and the second outer electrode 42 are the ground electrodes. It is necessary to connect the drive electrode which applies a drive signal, by the driver IC 51 and a wiring structure having a high reliability of conduction. Consequently, when each of the first outer electrode 41 and the second outer electrode 42 is a drive electrode, the overall wiring structure becomes complicated. On the other hand, since a wiring structure for keeping a constant-voltage electrode at a predetermined constant voltage does not necessitate an arrangement for switching individually for each pressure chamber 24, it is possible to make a simple arrangement as compared to the drive electrode. Concretely, in the embodiment, the first outer electrodes 41 and the second outer electrodes 42 of the plurality of piezoelectric actuators 22 are brought into mutual conduction and let to be the first common electrode 33 and the second common electrode 34, and moreover, the first common electrode 33 and the second common electrode 34 are brought into conduction by the electrode connecting portions 43 having a simple structure, formed by the electroconductive paste. Moreover, it is possible to keep all the first outer electrodes 41 and the second outer electrodes 42 of the plurality of piezoelectric actuators 22 at the ground electric potential just by connecting the first common electrode 33 to the COP 50. In such manner, the inner electrode 40 is the drive electrode, and the first outer electrode 41 and the second outer electrode 42 is the constant-voltage electrodes. Therefore, it is possible to simplify the overall wiring arrangement of the piezoelectric actuator 22.

Moreover, for suppressing a fluctuation of electric potential from the ground at the time of driving the piezoelectric actuator 22 to be as small as possible, it is desirable to make an electrode area of the ground electrode to be as wide as possible, in the embodiment, the first outer electrodes 41 of the plurality of piezoelectric actuators 22 are brought into mutual conduction to form the first common electrode 33, and moreover, also the second outer electrodes 42 of the plurality of piezoelectric actuators 22 are brought into mutual conduction to form the second common electrode 34. Furthermore, by connecting the first common electrode 33 and the plurality of second common electrodes 34 by the electrode connecting portions 43, the total area of the ground electrode becomes wide.

Figure 10A:
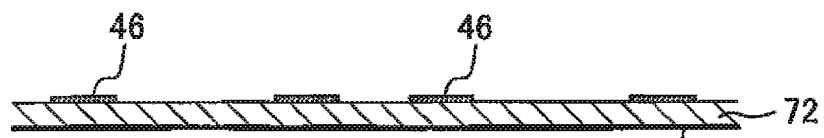
FIG. 10A, FIG. 10B, FIG. 10C, FIG. 10D, and FIG. 10E (hereinafter, 'FIG. 10A to FIG. 10E') are manufacturing process diagrams of an actuator unit.

Next, a manufacturing method of the actuator unit 21 having the abovementioned plurality of piezoelectric actuators 22 will be described below. FIG. 10A to FIG. 10E are manufacturing process diagrams of the actuator unit 21. As shown in FIG. 10A, to start with, the second common electrode 34 is formed by making an electroconductive material adhere by a method such as a screen printing and a vapor deposition on almost entire area of one surface of an unbaked green sheet 72 which becomes the second piezoelectric sheet 32. Next, the second low-permittivity portion 46 is formed by applying a mixture made by mixing a ceramics material such as alumina and zirconia with a liquid resin, on a surface of the green sheet 72, on an opposite side of the second common electrode 34.

Figure 10B:
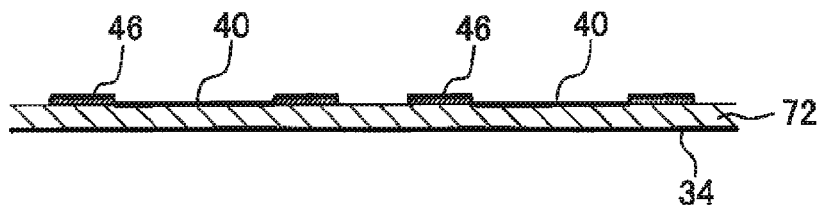
Figure 10C:
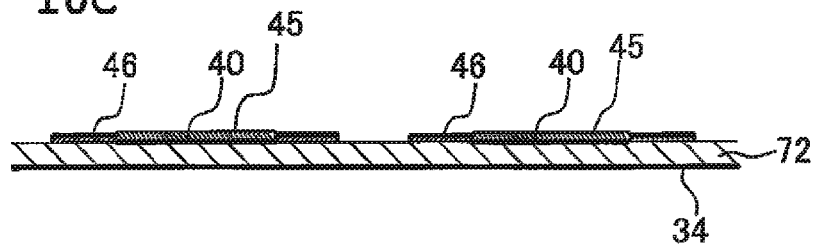

After the liquid resin is dried, as shown in FIG. 10B, the plurality of inner electrodes 40 are formed on a surface of the green sheet 72, on which the second low-permittivity portion 46 has been formed by making an electroconductive material adhere by a method such as the screen printing and the vapor deposition. Moreover, as shown in FIG. 10C, the first low-permittivity portion 45 is formed by applying a mixture made by mixing a ceramics material such as alumina and zirconia with a liquid resin on the plurality of inner electrodes 40.

Figure 10D:
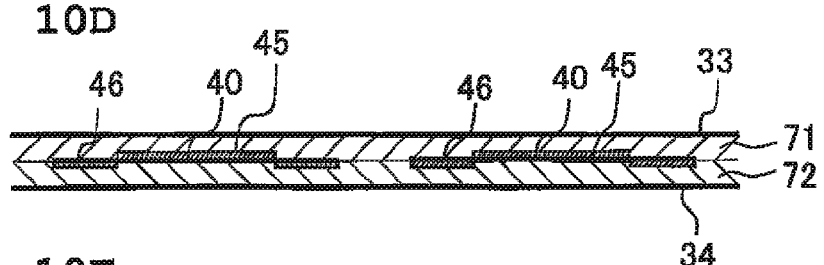

On the other hand, the first common electrode 33 is formed by making an electroconductive material adhere by a method such as the screen printing and the vapor deposition on almost entire area of one surface of an unbaked green sheet 71 which becomes the first piezoelectric sheet 31. Next, as shown in FIG. 10D, a surface of the green sheet 71, on an opposite side of the first common electrode 33 is superimposed on the surface of the green sheet 72 on which the first low-permittivity portion 45 has been formed.

Figure 10E:
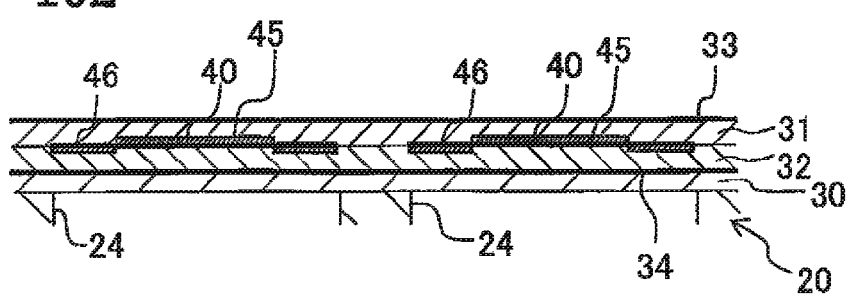

Further, a stacked body of two piezoelectric sheets namely, the first piezoelectric sheet 31 and the second piezoelectric sheet 32 is formed by baking the two green sheets 71 and 72 which have been stacked. When baked, the liquid resin present in the first low-permittivity portion 45 and the second low-permittivity portion 46 is exhausted by evaporation. Thereafter, as shown in FIG. 10E, the stacked body is joined to the ink separating film 30 by an adhesive, thereby completing the manufacturing of the actuator unit 21.

The first piezoelectric sheet 31 and the second piezoelectric sheet 32 are not necessarily required to be formed by baking a green sheet, and may be formed by a method such as a sol-gel method, a sputtering method, a CVT (chemical vapor deposition) method, a vapor deposition method, and an AD (aerosol deposition) method.

In the embodiment described above, the ink-jet head corresponds to a 'liquid droplet jetting apparatus', the channel unit 20 corresponds to a 'channel structure', and the driver IC 51 corresponds to a 'drive unit'. In the abovementioned description, the channel unit 20 has been formed by stacking the plurality of metallic plates. However, the present teaching is not necessarily restricted to the abovementioned arrangement. For instance, the channel unit 20 may be formed by a substrate made of silicon. In this case, it is possible to form a thin $SiO_2$ film having a thickness of about 1 μm by removing the silicon substrate by a method such as etching after an oxide layer ($SiO_2$ film) is formed on the silicon substrate, and it is possible to use the thin $SiO_2$ film as a vibration plate.

Next, modified embodiments in which various modifications are made in the embodiment will be described below. Same reference numerals are assigned to components having a structure similar as in the embodiment, and description to be repeated thereof will be omitted.

First Modified Embodiment

Figure 11:
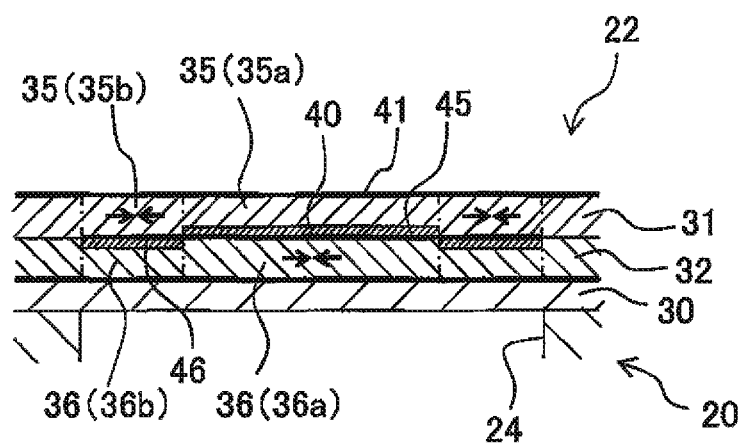
FIG. 11 is a cross-sectional view of a piezoelectric actuator according to a first modified embodiment.

In a case of forming the ink separating film 30 by an electroconductive material, as shown in FIG. 11, the ink separating film 30 may serve as the second common electrode 34 as well, and the second common electrode 34 may be omitted.

Second Modified Embodiment

Figure 12:
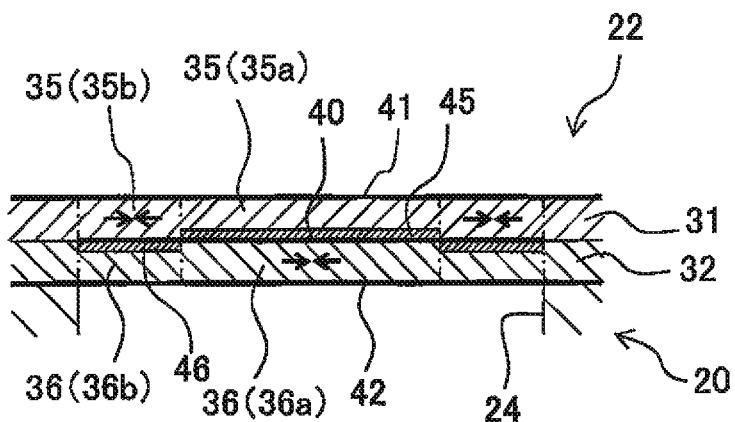
FIG. 12 is a cross-sectional view of a piezoelectric actuator according to a second modified embodiment.

The ink separating film 30 is not a component which is indispensable for the operation of the piezoelectric actuator 22, and it is possible to omit the ink separating film 30. For instance, as shown in FIG. 12, the second piezoelectric sheet 32 may be joined directly to the channel unit 20.

Third Modified Embodiment

Figure 13:
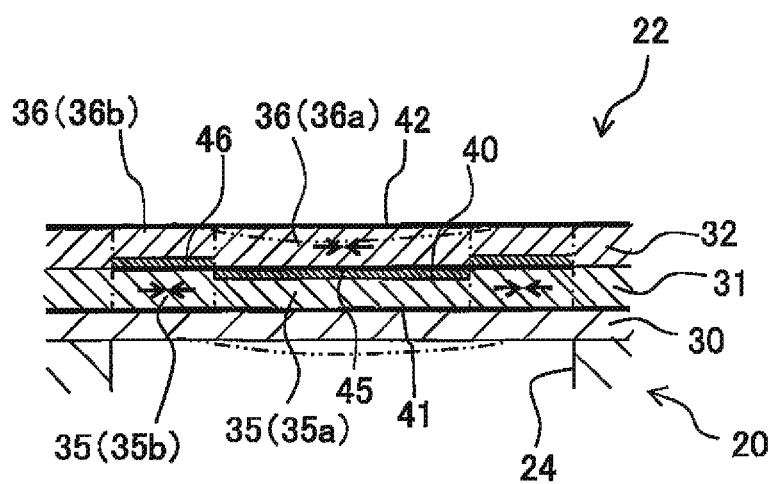
FIG. 13 is a cross-sectional view of a piezoelectric actuator according to a third modified embodiment.

As shown in FIG. 13, the layer may be stacked in order from a side of the channel unit 20 to a side of the first and second piezoelectric layers 35,36. In this case, when voltage V0 is applied to the first piezoelectric layer 35 and the second piezoelectric layer 36, in the second piezoelectric layer 36 on the upper side, the central portion 36*b* is deformed, whereas, in the first piezoelectric layer 35 on the lower side, the outer-edge portion 35*b* is deformed. Consequently, the piezoelectric actuator 22, as a whole, is deformed to form a projection toward the channel unit 20 as shown by an alternate long and two short dashes line in FIG. 13.

Even though when the voltage V0 is applied, the piezoelectric actuator 22 is deformed to form a projection downward, or in other words, toward the channel unit 20 as shown in FIG. 13, the pulling ejection which has been described above is possible. However, in the pulling ejection, the volume of the pressure chamber 24 is made large in the beginning and the pressure is reduced. Therefore, in the piezoelectric actuator 22 as in FIG. 13, the piezoelectric actuator 22 is deformed to form a projection downward in a stand-by state before jetting the ink, and the volume of the pressure chamber 24 is increased by changing from the deformed state to a flat state. In other words, during the stand-by state, since it is necessary to apply the voltage V0 all the time, from a point of view of life of the piezoelectric actuator 22, such an arrangement is disadvantageous as compared to the arrangement in the embodiment.

Fourth Modified Embodiment

In each piezoelectric actuator 22, the first outer electrode 41 and the second outer electrode 42 may be drive electrodes to which a drive signal is applied from the driver IC 51, and the inner electrode 40 may be a constant-voltage electrode. For instance, in FIG. 14, the first-outer electrode 41 and the second outer electrode 42 are brought into conduction by an electroconductive material filled in a through hole 80 cut through the first piezoelectric layer 35 and the second piezoelectric layer 36. Moreover, since a connecting terminal 81 on an upper surface of the piezoelectric actuator 22, which has been brought into conduction with the first outer electrode 41 and the second outer electrode 42 is connected to the COF 50 on which the driver IC 51 has been mounted, a drive signal is applied to each of the first outer electrode 41 and the second outer electrode 42 from the driver IC 51. Moreover, the inner electrode 40 is kept at the ground electric potential by a connecting terminal 82 which has been brought into conduction with the inner electrode 40 being connected to a ground wire of the COF 50.

Figure 14:
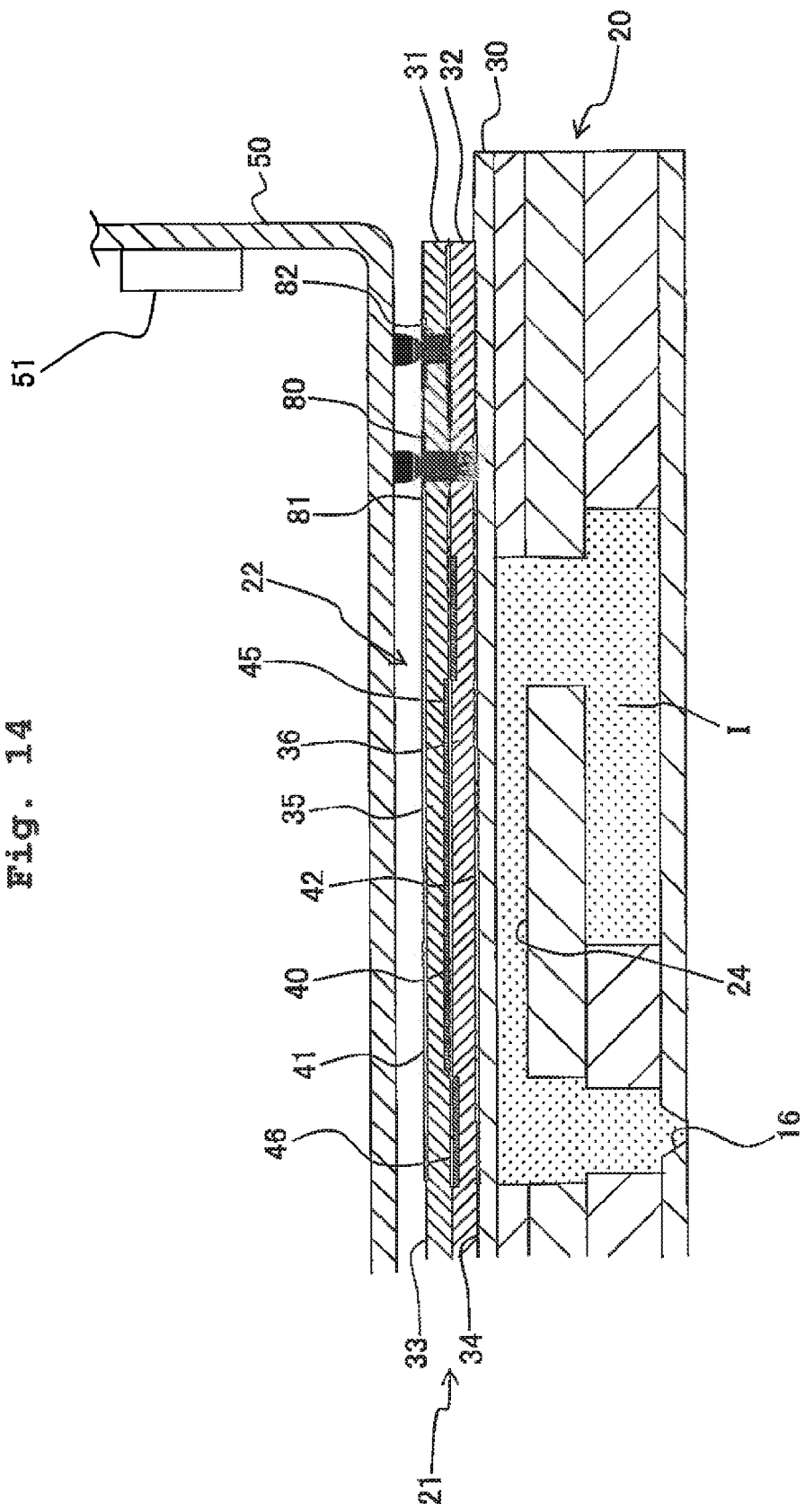
FIG. 14 is a cross-sectional view of a piezoelectric actuator according to a fourth modified embodiment.

Even in the piezoelectric actuator 22 having a structure as shown in FIG. 14, an operation similar to the operation in the embodiment is possible. However, in order to achieve that the first outer electrode 41 and the second outer electrode 42 are the drive electrodes, it is necessary that the first outer electrode 41 and the second outer electrode 42 are brought into conduction by forming the through hole 80 in the first piezoelectric layer 35 and the second piezoelectric layer 36. Consequently, a wiring arrangement may be somewhat complicated as compared to a case of bringing the first outer electrode 41 and the second outer electrode 42 into conduction by the electrode connecting portions 43 having a simple structure, which are provided at some locations of an outer peripheral portion of the actuator unit 21 as shown in FIG. 4 of the embodiment. Moreover, since it is necessary to form the through hole in the first piezoelectric layer 35 and the second piezoelectric layer 36, the number of processes of manufacturing increases. Furthermore, an increase in an amount of the electroconductive material to be filled in the through hole 80 leads to an increase in cost. It is tentatively possible to form the through hole 80 to be cut through the first piezoelectric layer 35 and the second piezoelectric layer 36 before baking, after superimposing (overlapping) the first piezoelectric layer 35 and the second piezoelectric layer 36, by a press process (stamping process) once. However, in a case of forming the through hole by press, an accuracy of hole is degraded when a thickness of the piezoelectric layer to be holed is substantial. From the point of view of the thickness of the piezoelectric layer, it is desirable to form the through hole in each of the first piezoelectric layer 35 and the second piezoelectric layer 36 before superimposing.

Fifth Modified Embodiment

Figure 15:
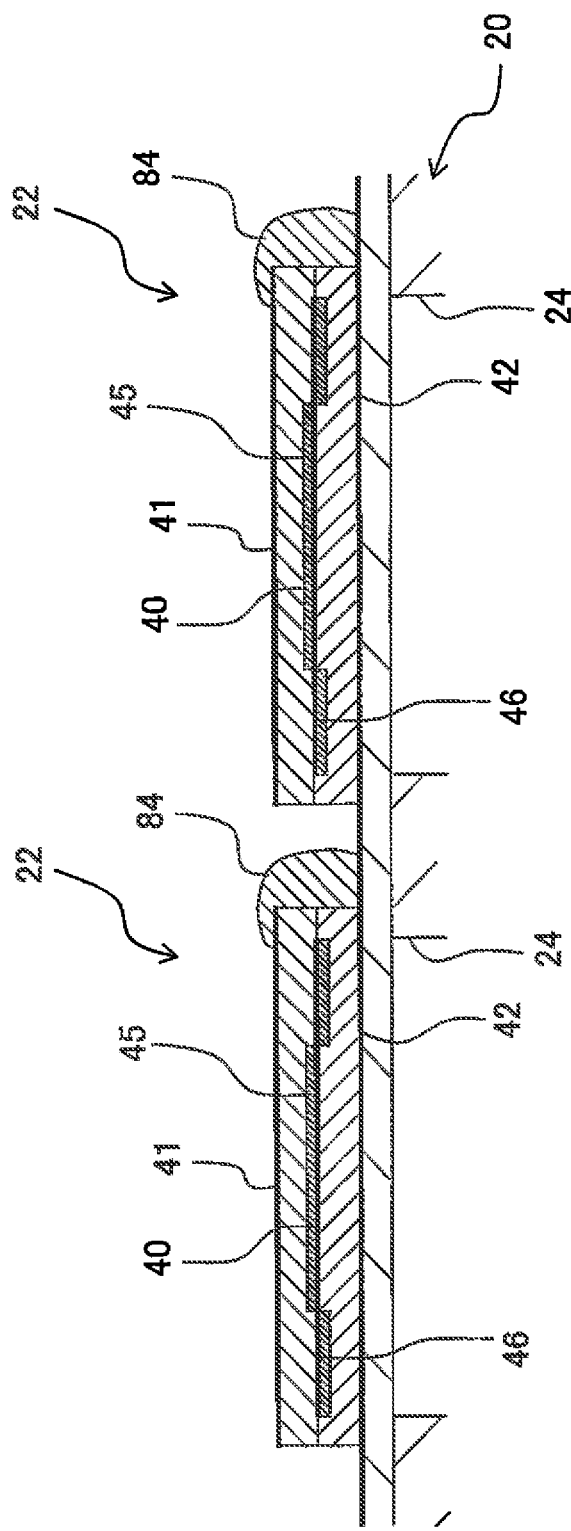
FIG. 15 is a top view of a second piezoelectric layer which is a lower layer of a piezoelectric actuator according to a fifth modified embodiment.

In the embodiment, the first piezoelectric layers 35 and the second piezoelectric layers 36 of the plurality of piezoelectric actuators 22 were joined to be formed integrally. However, the first piezoelectric layers 35 and the second piezoelectric layers 36 of the plurality of piezoelectric actuators 22 may be separated as shown in FIG. 15. In an arrangement shown in FIG. 15, the first outer electrode 41 and the second outer electrode 42 are brought into conduction by an electrode connecting portion 84 made of an electroconductive paste, which is formed on a side surface of the first piezoelectric layer 35 and the second piezoelectric layer 36. Moreover, the inner electrode 40 may be the drive electrode to which a drive signal is applied, or the first outer electrode 41 and the second outer electrode 42 may be the drive electrodes.

Sixth Modified Embodiment

In the present teaching, the improvement of the deformation efficiency is realized by deforming spontaneously the outer-edge portion of the piezoelectric actuator 22, since the second low-permittivity portion 46 is arranged at a position near the outer edge of the pressure chamber 24, with respect to the first low-permittivity portion 45 which is arranged to face the central portion of the pressure chamber 24. From the abovementioned point of view, it is preferable that the second low-permittivity portion 46 is at a position nearer to the outer edge of the pressure chamber 24 than the first low-permittivity portion 45, and the second low-permittivity portion 46 is not required to be arranged to enclose (surround) the first low-permittivity portion 45 as in the embodiment. In other words, the second low-permittivity portion 46 may be arranged only on a part of the outer-edge portion 36b of the second piezoelectric layer 36.

Figure 16A:
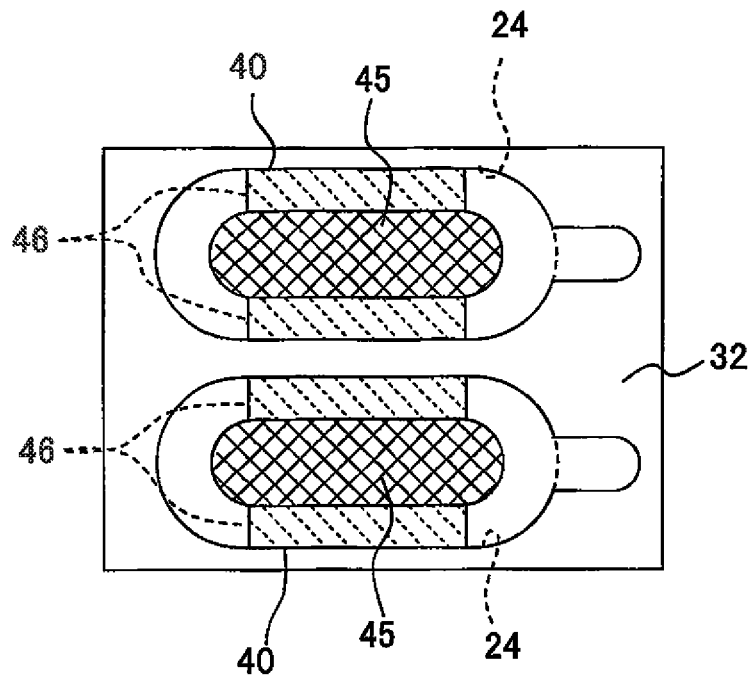
FIG. 16A and FIG. 16B are cross-sectional views of a piezoelectric actuator according to a sixth modified embodiment.
Figure 16B:
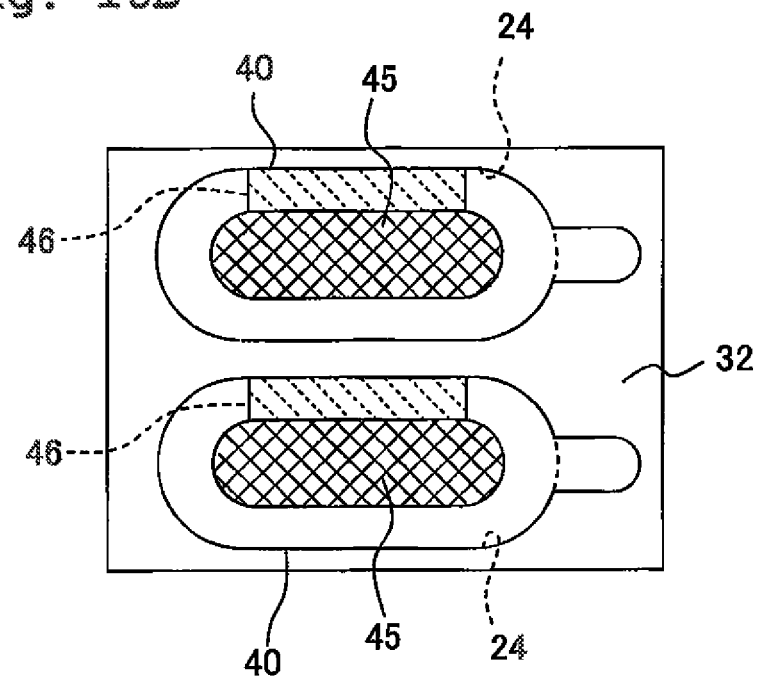

For instance, the two second low-permittivity portions 46 may be arranged to sandwich the first low-permittivity portion 45, in a direction parallel to the in-plane direction of the piezoelectric layer as shown in FIG. 16A. In FIG. 16A, the second low-permittivity portions 46 are arranged to sandwich the first low-permittivity portion 45 in a direction of width of the elliptical-shaped pressure chamber 24. However, the second low-permittivity portions 46 may be arranged to sandwich the first low-permittivity portion 45 in a longitudinal direction of the pressure chamber 24. Moreover, only one second low-permittivity portion 46 may be arranged on an outer of the first low-permittivity portion 45 as shown in FIG. 16B.

Moreover, the inner electrode 40, the first outer electrode 41, and the second outer electrode 42 are not necessarily required to face the entire area of the pressure chamber 24, and may face a partial area including the central portion of the pressure chamber 24, of the area facing the pressure chamber 24. The first low-permittivity portion 45 may be formed not only on the central portion 35a of the first piezoelectric layer 35, facing the central portion of the pressure chamber 24, but also on a part of the outer-edge portion 35b. Conversely, the second low-permittivity portion 46 may be formed not only on the outer-edge portion 36b of the second piezoelectric layer 36, facing the outer-edge portion of the pressure chamber 24, but also on a part of the central portion 36a.

Seventh Modified Embodiment

Figure 17:
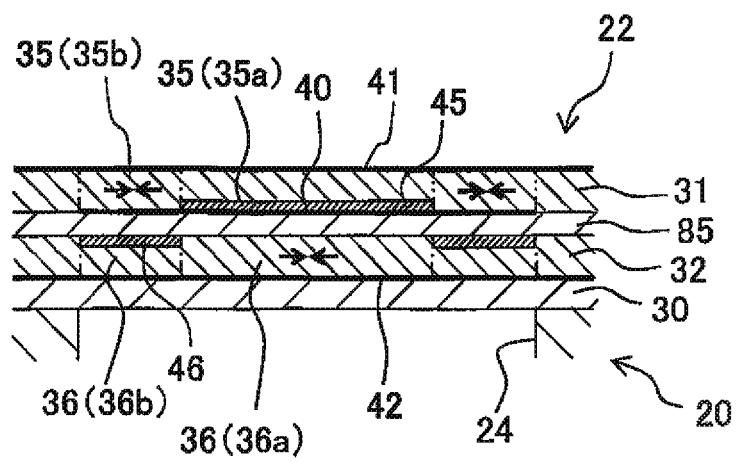
FIG. 17 is a cross-sectional view of a piezoelectric actuator according to a seventh modified embodiment.

Another layer may be interposed between the first piezoelectric layer 35 and the second piezoelectric layer 36. For instance, the first piezoelectric layer 35 and the second piezoelectric layer 36 may be stacked sandwiching another piezoelectric layer 85 as shown in FIG. 17.

Eighth Modified Embodiment

Figure 18:
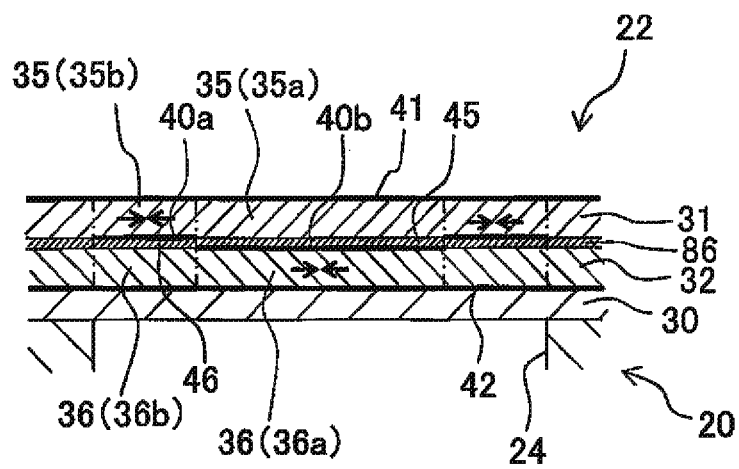
FIG. 18 is a cross-sectional view of a piezoelectric actuator according to an eighth modified embodiment.

The first low-permittivity portion 45 and the second low-permittivity portion 46 may exist on a same plane (same surface), and form one low-permittivity layer 86 as shown in FIG. 18. In this case, the inner electrode 40 is divided into a first portion 40a which is positioned at an upper side of the low-permittivity layer 86 and a second portion 40b which is positioned at a lower side of the low-permittivity layer 86, and the first portion 40a and the second portion 40b are formed on different planes (surfaces).

Even in the piezoelectric actuator 22 having the abovementioned arrangement, an operation similar to the operation in the embodiment is possible. However, when the inner electrode 40 is divided into the two portions namely, the first portion 40a and the second portion 40b which are arranged on different planes, since it becomes necessary to connect the two portions 40a and 40b, a wiring structure to the inner electrode 40 becomes complicated. From the abovementioned point of view, it is preferable that the first portion 40a facing the outer-edge portion of the pressure chamber 24 of the inner electrode 40 and the second portion 40b facing the central portion of the pressure chamber 24 of the inner electrode 40 are arranged on the same plane, between the first piezoelectric layer 35 and the second piezoelectric layer 36.

Ninth Modified Embodiment

Figure 19:
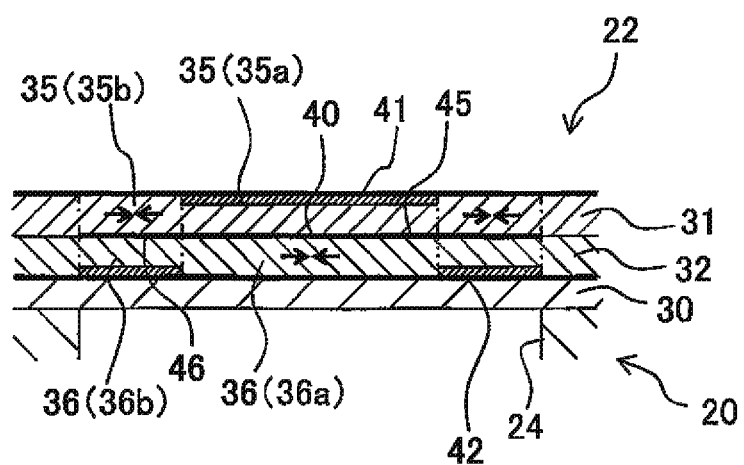
FIG. 19 is a cross-sectional view of a piezoelectric actuator according to a ninth modified embodiment.

The first low-permittivity portion 45 and the second low-permittivity portion 46 may be arranged between the first piezoelectric layer 35 and the second piezoelectric layer 36, and the first outer electrode 41 and the second outer electrode 42 as shown in FIG. 19. Even in such arrangement, almost no electric field acts on a portion of the first piezoelectric layer 35 and the second piezoelectric layer 36, on which the first low-permittivity portion 45 and the second low-permittivity portion 46 exist, and only a portion of the first piezoelectric layer 35 and the second piezoelectric layer 36 on which the first low-permittivity portion 45 and the second low-permittivity portion 46 do not exist, contract.

Tenth Modified Embodiment

Figure 20:
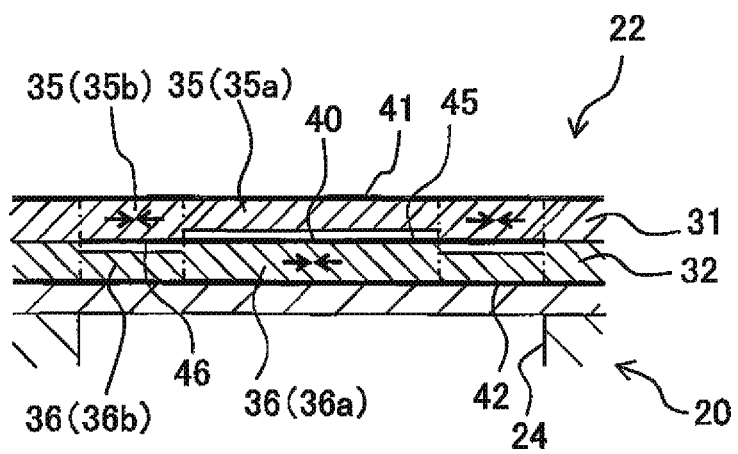
FIG. 20 is a cross-sectional view of a piezoelectric actuator according to a tenth modified embodiment.

The first low-permittivity portion 45 and the second low-permittivity portion 46 may be cavities or vacant space as shown in FIG. 20. A permittivity of air in the cavity is almost equivalent to a permittivity of vacuum ($8.85 \times 10^{-12}$ F/m), and is significantly low as compared to a permittivity of PZT. Therefore, the cavities in FIG. 20 are capable of fulfilling a function as the first low-permittivity portion 45 and the second low-permittivity portion 46 of the present teaching.

The embodiment and the modified embodiments described above are examples in which the present teaching is applied to an ink-jet head which is a liquid droplet jetting apparatus including a plurality of nozzles. However, the application of the present teaching is not restricted to the embodiment and the modified embodiments described above. For instance, the present teaching may also be applied to a liquid droplet jetting apparatus which includes one nozzle, and one pressure chamber which communicates with the nozzle. Moreover, the piezoelectric actuator according to the present teaching is not restricted to an actuator which is used for a purpose of applying a pressure to a liquid. For instance, the piezoelectric actuator of the present teaching may be an actuator which is to be used for a purpose of causing a displacement and vibration of a solid (substance).

What is claimed is:

1. A liquid droplet jetting apparatus configured to jet liquid droplets onto a medium, comprising:
   a channel unit having liquid channels including a nozzle and a pressure chamber communicating with the nozzle formed therein;
   a piezoelectric actuator disposed on the channel unit to cover the pressure chamber; and
   a drive unit configured to drive the piezoelectric actuator, wherein the piezoelectric actuator includes:
   a first piezoelectric layer and a second piezoelectric layer which are stacked in a thickness direction thereof, and which cover the pressure chamber;
   an inner electrode disposed between the first piezoelectric layer and the second piezoelectric layer, facing the pressure chamber;
   a first outer electrode disposed in an area facing the inner electrode, of a surface of the first piezoelectric layer on an opposite side of the second piezoelectric layer;

a second outer electrode disposed in an area facing the inner electrode, of a surface of the second piezoelectric layer on an opposite side of the first piezoelectric layer;
a first low-permittivity portion having a permittivity lower than a permittivity of the first piezoelectric layer, which is disposed between the inner electrode and the first piezoelectric layer or between the first outer electrode and the first piezoelectric layer, facing a central portion of the pressure chamber; and
a second low-permittivity portion having a permittivity lower than a permittivity of the second piezoelectric layer, which is disposed between the inner electrode and the second piezoelectric layer or between the second outer electrode and the second piezoelectric layer, facing a portion near an outer edge of the central portion of the pressure chamber; and
wherein the drive unit is configured to generate an electric potential difference between the inner electrode and the first outer electrode, and between the inner electrode and the second outer electrode.

2. The liquid droplet jetting apparatus according to claim 1;
wherein the first low-permittivity portion is disposed between the inner electrode and the first piezoelectric layer; and
wherein the second low-permittivity portion is disposed between the inner electrode and the second piezoelectric layer.

3. The liquid droplet jetting apparatus according to claim 2;
wherein a portion of the inner electrode, facing the central portion of the pressure chamber, and a portion of the inner electrode facing the portion near to the outer edge of the central portion of the pressure chamber are disposed on a same plane, between the first piezoelectric layer and the second piezoelectric layer.

4. The liquid droplet jetting apparatus according to claim 1;
wherein each of the first outer electrode and the second outer electrode is a constant-voltage electrode configured to apply a constant voltage; and
wherein the inner electrode is a drive electrode configured to apply a drive signal.

5. The liquid droplet jetting apparatus according to claim 1;
wherein the channel unit has a plurality of pressure chambers; and
wherein the plurality of piezoelectric actuators is provided corresponding to the plurality of pressure chambers.

6. The liquid droplet jetting apparatus according to claim 5;
wherein the first outer electrodes of the plurality of piezoelectric actuators are brought into mutual conduction to form a first common electrode;
wherein the second outer electrodes of the plurality of piezoelectric actuators are also brought into mutual conduction to form a second common electrode;
wherein the liquid jetting apparatus further includes an electrode connecting portion connecting the first common electrode and the second common electrode;
wherein each of the first common electrode and the second common electrode is a ground electrode configured to apply a constant voltage; and
wherein the inner electrode is a drive electrode configured to apply a drive signal.

7. The liquid droplet jetting apparatus according to claim 5;
wherein the plurality of first piezoelectric layers of the plurality of piezoelectric actuators is formed integrally; and
wherein the plurality of second piezoelectric layers of the plurality of piezoelectric actuators is formed integrally.

8. The liquid droplet jetting apparatus according to claim 1;
wherein the first piezoelectric layer and the second piezoelectric layer are stacked in order of the second piezoelectric layer and the first piezoelectric layer from a side of the channel unit.

9. The liquid droplet jetting apparatus according to claim 1;
wherein the second low-permittivity portions are disposed to sandwich the first low-permittivity portion, in a direction orthogonal to a direction of stacking of the first piezoelectric layer and the second piezoelectric layer.

10. The liquid droplet jetting apparatus according to claim 9;
wherein the second low-permittivity portion is arranged to surround the first low-permittivity portion.

11. The liquid droplet jetting apparatus according to claim 1;
wherein the channel unit is formed of silicon.

12. The liquid droplet jetting apparatus according to claim 1;
wherein a magnitude of permittivity of each of the first piezoelectric layer and the second piezoelectric layer is not less than 50 times of a magnitude of permittivity of the first low-permittivity portion and the second low-permittivity portion respectively.

13. The liquid droplet jetting apparatus according to claim 1, further comprising:
a liquid separating film arranged between the second piezoelectric layer and the pressure chamber.

14. The liquid droplet jetting apparatus according to claim 1;
wherein, in an area facing the central portion of the pressure chamber, the first outer electrode, one of the first piezoelectric layer and the first low-permittivity portion, the other of the first piezoelectric layer and the first low-permittivity portion, the inner electrode, the second piezoelectric layer, and the second outer electrode are stacked in the thickness direction; and
wherein, in an area facing the portion near the outer edge of the central portion of the pressure chamber, the first outer electrode, the first piezoelectric layer, the inner electrode, one of the second piezoelectric layer and the second low-permittivity portion, the other of the second piezoelectric layer and the second low-permittivity portion, and the second outer electrode are stacked in the thickness direction 15. The liquid droplet jetting apparatus according to claim 1;
wherein, in a case that the drive unit generates the electric potential difference between the inner electrode and the first outer electrode and between the inner electrode and the second outer electrode, the first piezoelectric layer, in an area facing the central portion of the pressure chamber, is deformed in an opposite direction as compared with the second piezoelectric layer in an area facing the portion near the outer edge of the central portions of the pressure chamber.

16. A piezoelectric actuator comprising:
a first piezoelectric layer and a second piezoelectric layer which are stacked mutually;
an inner electrode disposed between the first piezoelectric layer and the second piezoelectric layer;
a first outer electrode disposed in an area facing the inner electrode, of a surface of the first piezoelectric layer on an opposite side of the second piezoelectric layer;
a second outer electrode disposed in an area facing the inner electrode, of a surface of the second piezoelectric layer on an opposite side of the first piezoelectric layer;

a first low-permittivity portion having a permittivity lower than a permittivity of the first piezoelectric layer, which is disposed between the inner electrode and the first piezoelectric layer or between the first outer electrode and the first piezoelectric layer, facing a central portion of the inner electrode; and a second low-permittivity portion having a permittivity lower than a permittivity of the second piezoelectric layer, which is disposed between the inner electrode and the second piezoelectric layer or between the second outer electrode and the second piezoelectric layer, facing a portion on an outer edge of the central portion of the inner electrode.

* * * * *